(12) United States Patent
Guo

(10) Patent No.: US 12,106,807 B2
(45) Date of Patent: Oct. 1, 2024

(54) MEMORY DEVICE AND OPERATION BASED ON THRESHOLD VOLTAGE DISTRIBUTION OF MEMORY CELLS OF ADJACENT STATES

(71) Applicant: YANGTZE MEMORY TECHNOLOGIES CO., LTD., Wuhan (CN)

(72) Inventor: Xiaojiang Guo, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 0 days.

(21) Appl. No.: 17/689,713

(22) Filed: Mar. 8, 2022

(65) Prior Publication Data

US 2023/0290410 A1  Sep. 14, 2023

(51) Int. Cl.
| | | |
|---|---|---|
| G11C 16/04 | (2006.01) | |
| G11C 16/08 | (2006.01) | |
| G11C 16/26 | (2006.01) | |
| G11C 16/30 | (2006.01) | |
| H10B 43/27 | (2023.01) | |

(52) U.S. Cl.
CPC .......... *G11C 16/0483* (2013.01); *G11C 16/08* (2013.01); *G11C 16/26* (2013.01); *G11C 16/30* (2013.01); *H10B 43/27* (2023.02)

(58) Field of Classification Search
CPC ..... G11C 16/0483; G11C 16/08; G11C 16/26; G11C 16/30; H10B 43/27
See application file for complete search history.

(56) References Cited

U.S. PATENT DOCUMENTS

| | | | |
|---|---|---|---|
| 9,990,130 B2 | 6/2018 | Kwak | |
| 10,866,856 B2 | 12/2020 | Lee | |
| 10,990,327 B2 | 4/2021 | Park | |
| 2014/0016410 A1* | 1/2014 | Choi | G11C 11/5642 365/185.03 |
| 2015/0029796 A1* | 1/2015 | Choi | G11C 11/5642 365/189.05 |
| 2015/0340099 A1* | 11/2015 | Kwak | G11C 29/028 711/103 |
| 2018/0204624 A1 | 7/2018 | Yoon et al. | |
| 2020/0098436 A1 | 3/2020 | Kim et al. | |

FOREIGN PATENT DOCUMENTS

| | | |
|---|---|---|
| KR | 20180083689 A | 7/2018 |
| KR | 20200034123 A | 3/2020 |

\* cited by examiner

*Primary Examiner* — Sultana Begum
(74) *Attorney, Agent, or Firm* — BAYES PLLC

(57) ABSTRACT

In certain aspects, a memory device includes memory cells coupled to a same word line and bit lines, respectively, and a peripheral circuit coupled to the memory cells through the word line and the bit lines. Each of the memory cells is in one of states. The peripheral circuit is configured to determine a first number of a first set of the memory cells and a second number of a second set of the memory cells. Threshold voltages of the first set of the memory cells are between a first voltage and a second voltage larger than the first voltage. Threshold voltages of the second set of the memory cells are between the second voltage and a third voltage larger than the second voltage. The peripheral circuit is also configured to estimate a valley voltage corresponding to a first state of the states based, at least in part, on a comparison between the first number and the second number.

18 Claims, 17 Drawing Sheets

MEMORY DEVICE AND OPERATION BASED ON THRESHOLD VOLTAGE DISTRIBUTION OF MEMORY CELLS OF ADJACENT STATES

BACKGROUND

The present disclosure relates to memory devices and operation methods thereof.

Flash memory is a low-cost, high-density, non-volatile solid-state storage medium that can be electrically erased and reprogrammed. Flash memory includes NOR Flash memory and NAND Flash memory. Various operations can be performed by Flash memory, such as read, program (write), and erase, to change the threshold voltage of each memory cell to a desired level. For NAND Flash memory, an erase operation can be performed at the block level, and a program operation or a read operation can be performed at the page level.

SUMMARY

In one aspect, a memory device includes memory cells coupled to a same word line and bit lines, respectively, and a peripheral circuit coupled to the memory cells through the word line and the bit lines. Each of the memory cells is in one of states. The peripheral circuit is configured to determine a first number of a first set of the memory cells and a second number of a second set of the memory cells. Threshold voltages of the first set of the memory cells are between a first voltage and a second voltage larger than the first voltage. Threshold voltages of the second set of the memory cells are between the second voltage and a third voltage larger than the second voltage. The peripheral circuit is also configured to estimate a valley voltage corresponding to a first state of the states based, at least in part, on a comparison between the first number and the second number.

In some implementations, the valley voltage is equal to or larger than the third voltage when the first number is larger than the second number. In some implementations, the valley voltage is equal to or smaller than the first voltage when the first number is smaller than the second number. In some implementations, the valley voltage is equal to the second voltage when the first number is the same as the second number.

In some implementations, a difference between the second voltage and the first voltage is the same as a difference between the third voltage and the second voltage.

In some implementations, threshold voltages of the memory cells have distributions corresponding to the states, respectively. In some implementations, the first, second, and third voltages are between centers of two adjacent distributions of the distributions. In some implementations, the valley voltage is at a valley between the two adjacent distributions.

In some implementations, to determine the first and second numbers, the peripheral circuit includes a page buffer coupled to the memory cells through the bit lines, respectively, and configured to count a first number of times that a threshold voltage of a memory cell of the memory cells is in a range between a reference voltage and the first voltage, count a second number of times that a threshold voltage of a memory cell of the memory cells is in a range between the reference voltage and the second voltage, and count a third number of times that a threshold voltage of a memory cell of the memory cells is in a range between the reference voltage and the third voltage. In some implementations, to determine the first and second numbers, the peripheral circuit further includes control logic coupled to the page buffer and configured to calculate a difference between the second number of times and the first number of times as the first number of the first set of the memory cells, and calculate a difference between the third number of times and the second number of times as the second number of the second set of the memory cells.

In some implementations, the reference voltage is within one of the two adjacent distributions and is smaller than the first voltage.

In some implementations, to determine the first and second numbers, the page buffer is further configured to identify each of the memory cells that has a threshold voltage smaller than the reference voltage, and inhibit the identified memory cells when determining the first, second, and third numbers of times.

In some implementations, to determine the first and second numbers, the peripheral circuit further includes a word line driver coupled to the memory cells through the word line and configured to apply a read voltage to the word line. In some implementations, to determine the first and second numbers, the page buffer is further configured to pre-charge a first group of the bit lines for a first sense develop time, a second group of the bit lines for a second sense develop time, and a third group of the bit lines for a third sense develop time. In some implementations, the third sense develop time is longer than the second sense develop time, and the second sense develop time is longer than the first sense develop time.

In some implementations, the control logic is further configured to determine a first offset corresponding to the first state between the valley voltage and a first default read voltage corresponding to the first state, and determine a second offset corresponding to a second state of the states based, at least in part, on the first offset.

In some implementations, the control logic is further configured to determine a second read voltage corresponding to the second state based, at least in part, on the second offset and a second default read voltage corresponding to the second state, and initiate a read operation on the memory cells using at least the second read voltage.

In some implementations, the first state is a highest state of the states.

In some implementations, the memory device is a 3D NAND memory device.

In another aspect, a memory system includes a memory device configured to store data, and a memory controller coupled to the memory device. The memory device includes memory cells coupled to a same word line and bit lines, respectively, and a peripheral circuit coupled to the memory cells through the word line and the bit lines. Each of the memory cells is in one of states. The peripheral circuit is configured to determine a first number of a first set of the memory cells and a second number of a second set of the memory cells. Threshold voltages of the first set of the memory cells are between a first voltage and a second voltage larger than the first voltage. Threshold voltages of the second set of the memory cells are between the second voltage and a third voltage larger than the second voltage. The peripheral circuit is also configured to estimate a valley voltage corresponding to a first state of the states based, at least in part, on a comparison between the first number and the second number. The memory controller is configured to send a command to the peripheral circuit to cause the peripheral circuit to determine the first and second numbers and estimate the valley voltage.

In some implementations, the peripheral circuit is further configured to send information associated with the valley voltage to the memory controller.

In some implementations, the memory controller is further configured to determine an offset corresponding to a second state of the states based, at least in part, on the information associated with the valley voltage.

In some implementations, the information associated with the valley voltage includes the valley voltage or an offset corresponding to the first state between the valley voltage and a default read voltage corresponding to the first state.

In some implementations, the command is indicative of the first state.

In some implementations, threshold voltages of the memory cells have distributions corresponding to the states, respectively. In some implementations, the first, second, and third voltages are between centers of two adjacent distributions of the distributions. In some implementations, the valley voltage is at a valley between the two adjacent distributions.

In some implementations, the memory system includes solid-state drive (SSD) or a memory card.

In some implementations, the memory device is a 3D NAND memory device.

In still another aspect, a method for operating a memory device is provided. The memory device includes memory cells coupled to a same word line and bit lines, respectively. A first number of a first set of the memory cells and a second number of a second set of the memory cells are determined. Threshold voltages of the first set of the memory cells are between a first voltage and a second voltage larger than the first voltage. Threshold voltages of the second set of the memory cells are between the second voltage and a third voltage larger than the second voltage. A valley voltage corresponding to a first state of the states is estimated based, at least in part, on a comparison between the first number and the second number.

In some implementations, the valley voltage is equal to or larger than the third voltage when the first number is larger than the second number. In some implementations, the valley voltage is equal to or smaller than the first voltage when the first number is smaller than the second number. In some implementations, the valley voltage is equal to the second voltage when the first number is the same as the second number.

In some implementations, a difference between the second voltage and the first voltage is the same as a difference between the third voltage and the second voltage.

In some implementations, threshold voltages of the memory cells have distributions corresponding to the states, respectively. In some implementations, the first, second, and third voltages are between centers of two adjacent distributions of the distributions. In some implementations, the valley voltage is at a valley between the two adjacent distributions.

In some implementations, to determine the first and second numbers, a first number of times that a threshold voltage of a memory cell of the memory cells is in a range between a reference voltage and the first voltage is counted, a second number of times that a threshold voltage of a memory cell of the memory cells is in a range between the reference voltage and the second voltage is counted, and a third number of times that a threshold voltage of a memory cell of the memory cells is in a range between the reference voltage and the third voltage is counted. In some implementations, to determine the first and second numbers, a difference between the second number of times and the first number of times is calculated as the first number of the first set of the memory cells, and a difference between the third number of times and the second number of times is calculated as the second number of the second set of the memory cells.

In some implementations, the reference voltage is within one of the two adjacent distributions and is smaller than the first voltage.

In some implementations, to determine the first and second numbers, each of the memory cells that has a threshold voltage smaller than the reference voltage is identified, and the identified memory cells are inhibited when determining the first, second, and third numbers of times.

In some implementations, to determine the first and second numbers, a read voltage is applied to the word line. In some implementations, to determine the first and second numbers, a first group of the bit lines is pre-charged for a first sense develop time, a second group of the bit lines is pre-charged for a second sense develop time, and a third group of the bit lines is pre-charged for a third sense develop time. In some implementations, the third sense develop time is longer than the second sense develop time, and the second sense develop time is longer than the first sense develop time.

In some implementations, the first state is a highest state of the states.

In some implementations, a first offset corresponding to the first state between the valley voltage and a first default read voltage corresponding to the first state is determined, and a second offset corresponding to a second state of the states is determined based, at least in part, on the first offset.

In some implementations, a second read voltage corresponding to the second state is determined based, at least in part, on the second offset and a second default read voltage corresponding to the second state, and a read operation on the memory cells using at least the second read voltage is initiated.

BRIEF DESCRIPTION OF THE DRAWINGS

The accompanying drawings, which are incorporated herein and form a part of the specification, illustrate aspects of the present disclosure and, together with the description, further serve to explain the principles of the present disclosure and to enable a person skilled in the pertinent art to make and use the present disclosure.

Figure 1:
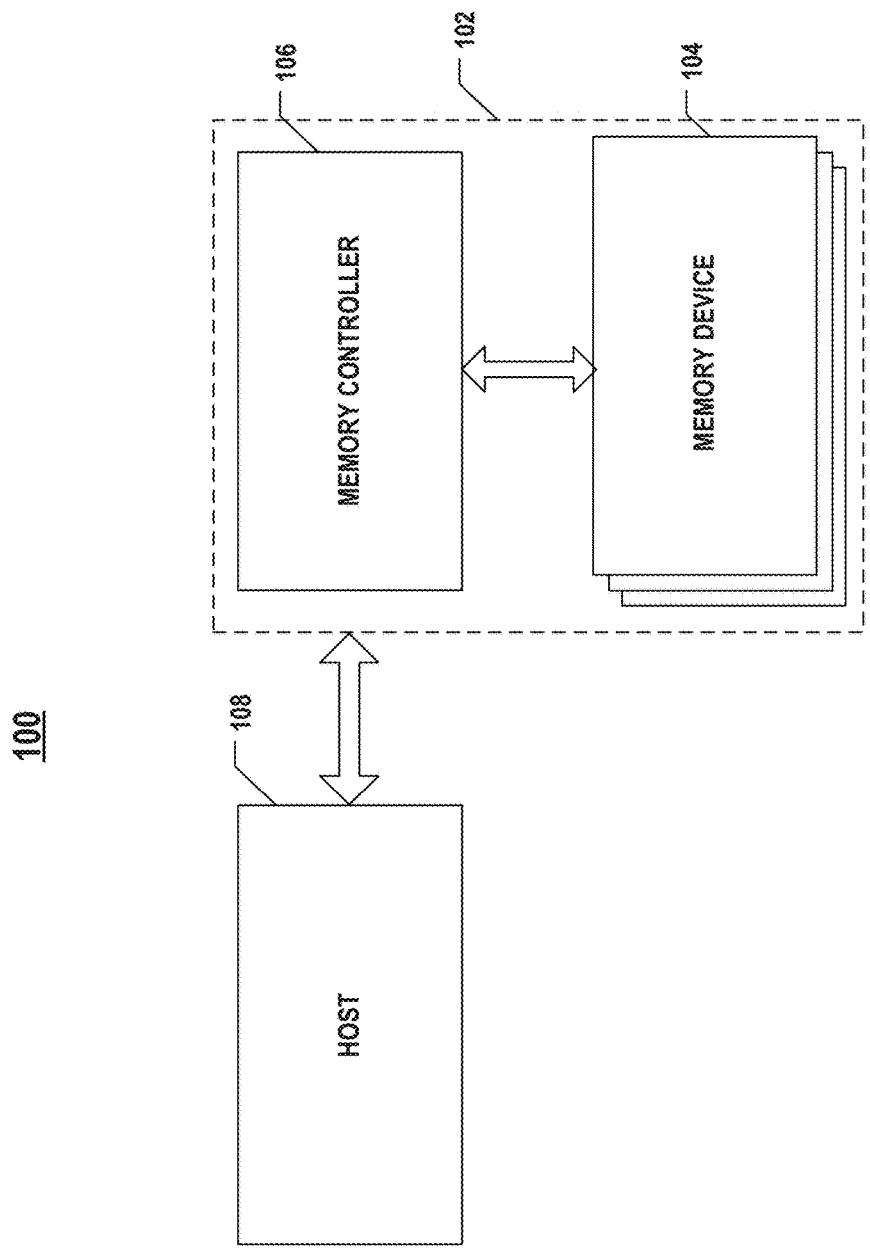
FIG. 1 illustrates a block diagram of a system having a memory device, according to some aspects of the present disclosure.

The present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present disclosure.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

NAND Flash memory devices can perform read operations at the page level. After program operations, the threshold voltages (Vt) of the memory cells are separated into multiple distributions each corresponding to a respective state (e.g., the erased state or one of the programed states). Known read operations use pre-defined word line voltages as read voltage levels. To minimize read errors, the read voltage levels are usually at the valleys between adjacent distributions of the threshold voltages of the memory cells. However, memory cells of NAND Flash memory devices tend to lose charge with time (a.k.a., retention charge loss). As a result, the threshold voltage distributions of the memory cells, especially the higher distribution(s), will shift down over time. Moreover, other phenomena, such as the back pattern effect in open blocks, also cause the shift of the threshold voltage distributions. Accordingly, the pre-defined, fixed read voltage levels cannot track the distribution shift in read operations.

To address one or more of the aforementioned issues, the present disclosure introduces a dynamic automatic valley detection (AVD) scheme that can track the shift of threshold voltage distributions due to retention, back pattern effect, and/or any other phenomena in real-time. With the real-time valley detection, optimized read voltage levels can be used in the read operations, and read errors can be minimized. In some implementations, the dynamic AVD schemes disclosed herein achieve multiple read levels in the same operation by dividing the memory cells into multiple groups and performing the detection on multiple groups with different sense develop times in parallel, thereby reducing the total time for the valley detection. The results of the AVD can be used to assign optimal read level offsets and adjust the read voltage levels accordingly. The AVD scheme can be either implemented as part of a read operation to dynamically optimize the read operation, or implemented in a dedicated command issued by the memory controller to probe the up-to-date threshold voltage distributions of the memory cells in the memory cell as needed.

FIG. 1 illustrates a block diagram of an exemplary system 100 having a memory device, according to some aspects of the present disclosure. System 100 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 1, system 100 can include a host 108 and a memory system 102 having one or more memory devices 104 and a memory controller 106. Host 108 can be a processor of an electronic device, such as a central processing unit (CPU), or a system-on-chip (SoC), such as an application processor (AP). Host 108 can be configured to send or receive data to or from memory devices 104. In order to send or receive data to or from memory devices 104, host 108 can send instructions to memory system 102 besides the data.

Memory device 104 can be any memory device disclosed in the present disclosure. As disclosed below in detail, memory device 104, such as a 3D NAND memory device, can be configured to perform dynamic AVD to estimate a valley voltage corresponding to one of the states of the memory cells (e.g., the highest programmed state) based on the comparison between the numbers of memory cells in adjacent threshold voltage ranges in the valley and/or surrounding the valley. Consistent with the scope of the present disclosure, in some implementations, memory device 104 is further configured to determine the read voltage level offsets corresponding to other states based on the estimated valley voltage, adjust the read voltages based on the offsets, and perform a read operation based on the adjusted read voltages. As a result, the shift of the threshold voltage distributions of the memory cells due to retention charge loss or any other factors can be dynamically tracked and compensated for in read operations, thereby reducing the read errors.

Memory controller 106 is coupled to memory device 104 and host 108 and is configured to control memory device 104, according to some implementations. Memory controller 106 can manage the data stored in memory device 104 and communicate with host 108. In some implementations, memory controller 106 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 106 is designed for operating in a high duty-cycle environment SSDs or embedded multi-media-cards (eMMCs) used as data storage for mobile devices, such as smartphones, tablets, laptop computers, etc., and enterprise storage arrays. Memory controller 106 can be configured to control operations of memory device 104, such as read, erase, and program operations. For example, based on the instructions received from host 108, memory controller 106 may transmit various commands to memory device 104, e.g., program command, read command, erase command, etc., to control the operations of memory device 104.

Consistent with the scope of the present disclosure, in some implementations, memory controller 106 is configured to send an AVD command indicative of a state to memory device 104 to cause memory device 104 to perform dynamic AVD to estimate the valley voltage corresponding to the state. In some implementations, memory controller 106 is further configured to receive information associated with the valley voltage, such as the valley voltage or the read voltage offset between the valley voltage and the corresponding default read voltage, and determine the read voltage level offsets corresponding to other states based on the received information.

Memory controller 106 can also be configured to manage various functions with respect to the data stored or to be stored in memory device 104 including, but not limited to bad-block management, garbage collection, logical-to-physical address conversion, wear leveling, etc. In some implementations, memory controller 106 is further configured to process error correction codes (ECCs) with respect to the data read from or written to memory device 104. Any other suitable functions may be performed by memory controller 106 as well, for example, formatting memory device 104. Memory controller 106 can communicate with an external device (e.g., host 108) according to a particular communication protocol. For example, memory controller 106 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Figure 2A:
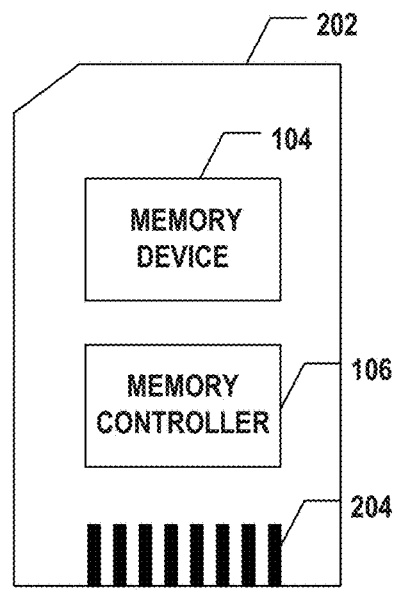
FIG. 2A illustrates a diagram of a memory card having a memory device, according to some aspects of the present disclosure.
Figure 2B:
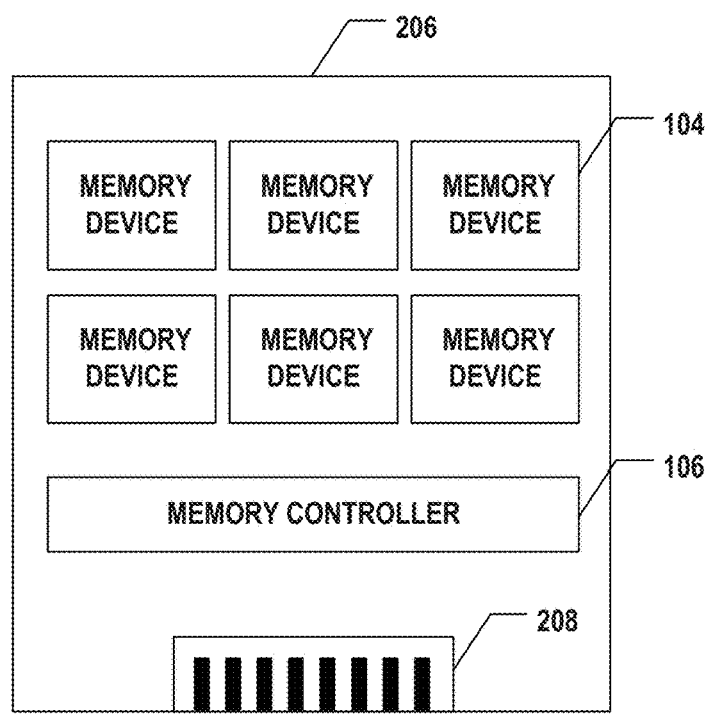
FIG. 2B illustrates a diagram of an SSD having a memory device, according to some aspects of the present disclosure.

Memory controller 106 and one or more memory devices 104 can be integrated into various types of storage devices, for example, be included in the same package, such as a universal Flash storage (UFS) package or an eMMC package. That is, memory system 102 can be implemented and packaged into different types of end electronic products. In one example as shown in FIG. 2A, memory controller 106 and a single memory device 104 may be integrated into a memory card 202. Memory card 202 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. Memory card 202 can further include a memory card connector 204 configured to couple memory card 202 to a host (e.g., host 108 in FIG. 1). In another example as shown in FIG. 2B, memory controller 106 and multiple memory devices 104 may be integrated into an SSD 206. SSD 206 can further include an SSD connector 208 configured to couple SSD 206 to a host (e.g., host 108 in FIG. 1). In some implementations, the storage capacity and/or the operation speed of SSD 206 is greater than those of memory card 202.

Figure 3:
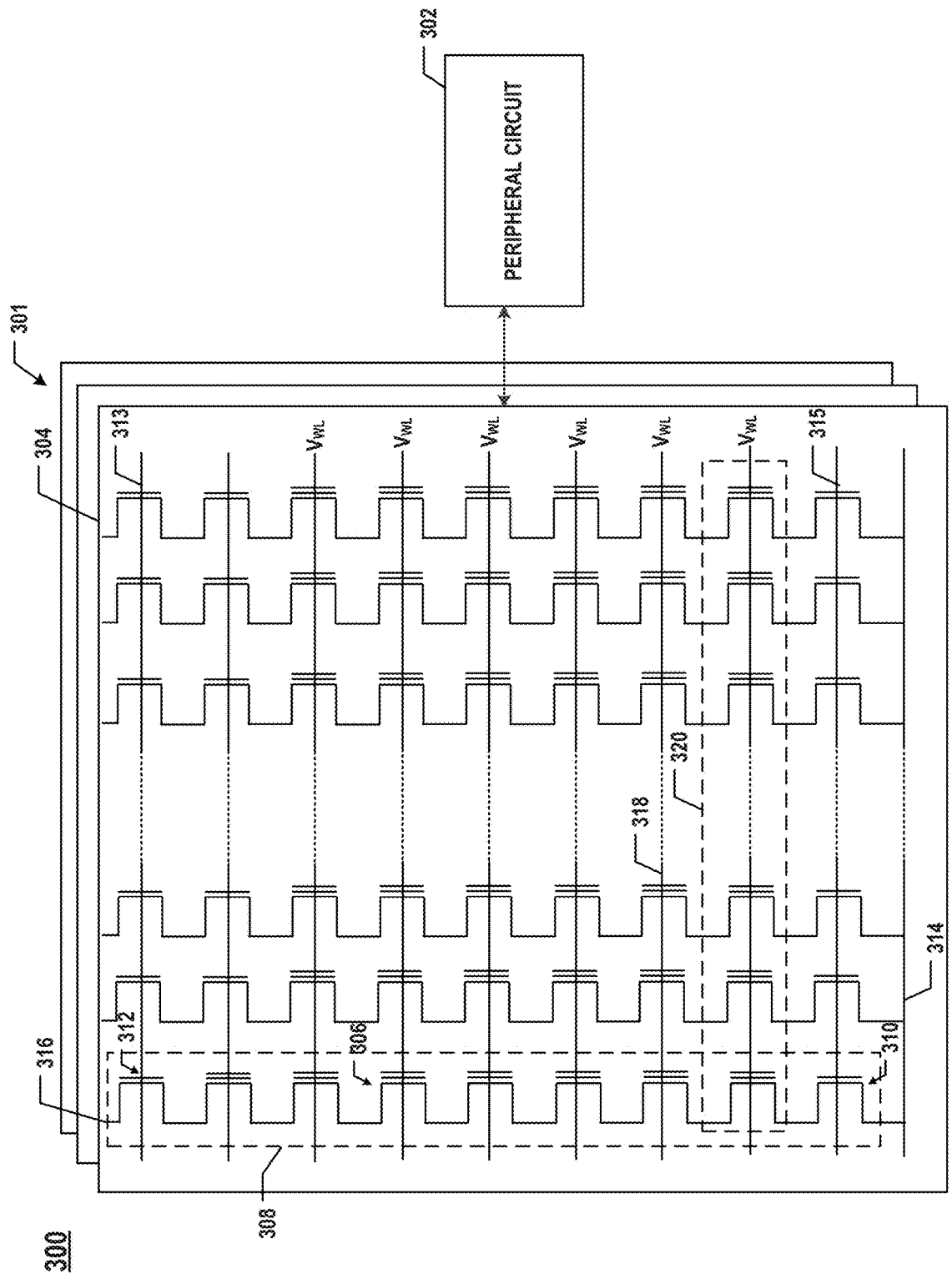
FIG. 3 illustrates a schematic diagram of a memory device including peripheral circuits, according to some aspects of the present disclosure.

FIG. 3 illustrates a schematic circuit diagram of an exemplary memory device 300 including peripheral circuits 302, according to some aspects of the present disclosure. Memory device 300 can be an example of memory device 104 in FIG. 1. Memory device 300 can include a memory cell array 301 and peripheral circuits 302 coupled to memory cell array 301. Memory cell array 301 can be a NAND Flash memory cell array in which memory cells 306 are provided in an array of NAND memory strings 308 each extending vertically above a substrate (not shown). In some implementations, each NAND memory string 308 includes a plurality of memory cells 306 coupled in series and stacked vertically. Each memory cell 306 can hold a continuous, analog value, such as an electrical voltage or charge, which depends on the number of electrons trapped within a region of memory cell 306. Each memory cell 306 can be either a floating gate type of memory cell including a floating-gate transistor or a charge trap type of memory cell including a charge-trap transistor.

In some implementations, each memory cell 306 is a single-level cell (SLC) that has two possible states and thus, can store one bit of data. For example, the first state "0" can correspond to a first distribution of threshold voltages, and the second state "1" can correspond to a second distribution of threshold voltages. In some implementations, each memory cell 306 is an xLC that is capable of storing more than a single bit of data in more than two states (levels). For example, the xLC may store two bits per cell (MLC), three bits per cell (TLC), or four bits per cell (QLC)). Each xLC can be programmed to assume a range of possible nominal storage values (i.e., $2^N$ pieces of N-bits data, e.g., gray codes). In one example, the MLC can be programmed to assume one of three possible programming levels (e.g., 01, 10, and 11) from an erased state by writing one of three possible nominal storage values to the cell. A fourth nominal storage value can be used for the erased state (e.g., 00).

As shown in FIG. 3, each NAND memory string 308 can also include a source select gate (SSG) transistor 310 at its source end and a drain select gate (DSG) transistor 312 at its drain end. SSG transistor 310 and DSG transistor 312 can be configured to activate select NAND memory strings 308 (columns of the array) during read and program operations. In some implementations, the sources of NAND memory strings 308 in the same block 304 are coupled through a same source line (SL) 314, e.g., a common SL. In other words, all NAND memory strings 308 in the same block 304 have an array common source (AC S), according to some implementations. The drain of each NAND memory string 308 is coupled to a respective bit line 316 from which data can be read or written via an output bus (not shown), according to some implementations. In some implementations, each NAND memory string 308 is configured to be selected or unselected by applying a DSG select voltage or a DSG unselect voltage to the gate of respective DSG transistor 312 through one or more DSG lines 313 and/or by applying an SSG select voltage or an SSG unselect voltage to the gate of respective SSG transistor 310 through one or more SSG lines 315. NAND memory string 308 can thus become a select NAND memory string or an unselect NAND memory string.

As shown in FIG. 3, NAND memory strings 308 can be organized into multiple blocks 304, each of which can have a common source line 314, e.g., coupled to an ACS. In some implementations, each block 304 is the basic data unit for erase operations, i.e., all memory cells 306 on the same block 304 are erased at the same time. To erase memory cells 306 in a select block 304, source lines 314 coupled to select block 304 as well as unselect blocks 304 in the same plane as select block 304 can be biased with an erase voltage (Vers), such as a high positive voltage (e.g., 20 V or more). Memory cells 306 of adjacent NAND memory strings 308 can be coupled through word lines 318 that select which row of memory cells 306 is affected by read and program operations. In some implementations, each word line 318 is coupled to a page 320 of memory cells 306, which is the basic data unit for program and read operations. The size of one page 320 in bits can relate to the number of NAND memory strings 308 coupled by word line 318 in one block 304. Each word line 318 can include a plurality of control gates (gate electrodes) at each memory cell 306 on respective page 320 and a gate line coupling the control gates.

As shown in FIG. 3, memory cell array 301 can include an array of memory cells 306 in a plurality of rows and a plurality of columns in each block 304. One row of memory cells 306 corresponds to one or more pages 320, and one column of memory cells corresponds to one NAND memory string 308, according to some implementations. The plurality of rows of memory cells 306 can be respectively coupled to word lines 318, and the plurality of columns of memory cells 306 can be respectively coupled to bit lines 316. Peripheral circuit 302 can be coupled to memory cell array 301 through bit lines 316 and word lines 318.

Figure 4A:
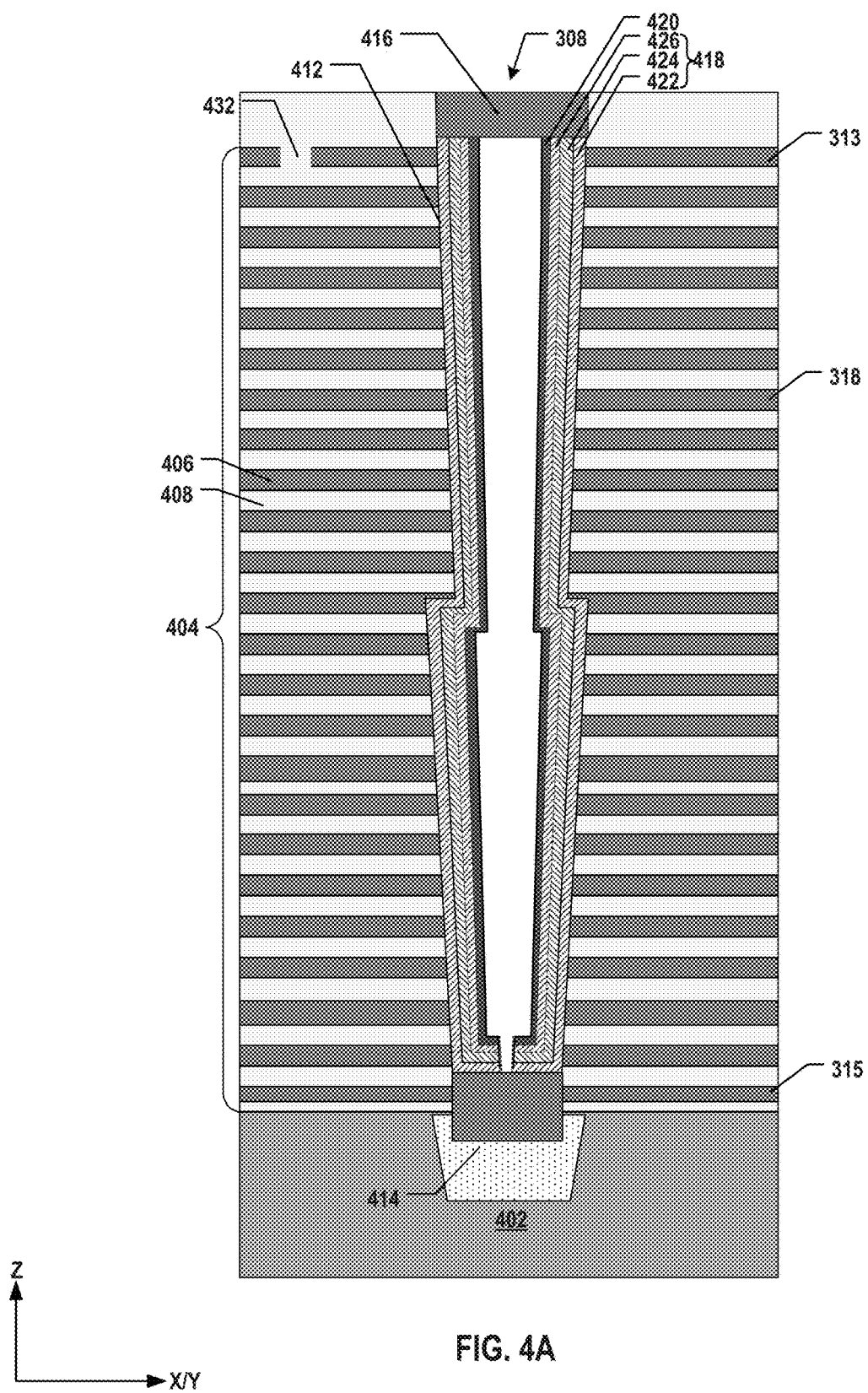
FIGS. 4A and 4B illustrate a side view and a plan view of cross-sections of a memory cell array including a NAND memory string, respectively, according to some aspects of the present disclosure.
Figure 4B:
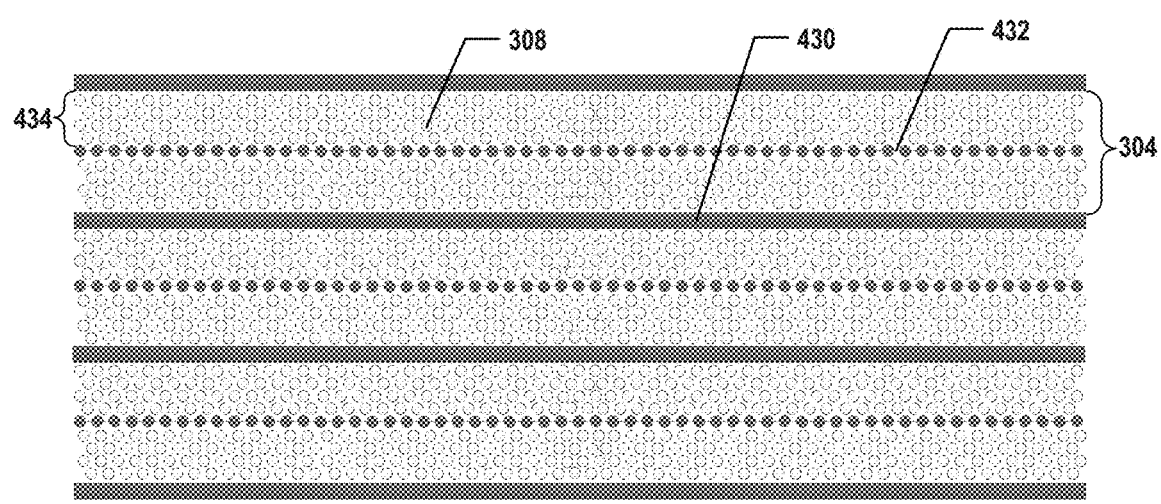

FIGS. 4A and 4B illustrate a side view and a plan view of cross-sections of an exemplary memory cell array 301 including NAND memory strings 308, respectively, according to some aspects of the present disclosure. As shown in FIG. 4A, NAND memory string 308 can extend vertically through a memory stack 404 above a substrate 402. Substrate 402 can include silicon (e.g., single crystalline silicon), silicon germanium (SiGe), gallium arsenide (GaAs), germanium (Ge), silicon on insulator (SOI), germanium on insulator (GOI), or any other suitable materials. It is noted that x, y, and z axes are included in FIG. 4A to further illustrate the spatial relationship of the components in a memory device. Substrate 402 includes two lateral surfaces extending laterally in the x-y plane: a top surface on the front side of the wafer on which the memory device can be formed, and a bottom surface on the backside opposite to the front side of the wafer. The z-axis is perpendicular to both the x and y axes. As used herein, whether one component (e.g., a layer or a device) is "on," "above," or "below" another component (e.g., a layer or a device) of the memory device is determined relative to substrate 402 of the memory device in the z-direction (the vertical direction perpendicular to the x-y plane) when substrate 402 is positioned in the lowest plane of the memory device in the z-direction. The same notion for describing the spatial relationships is applied throughout the present disclosure.

Memory stack 404 can include interleaved gate conductive layers 406 and gate-to-gate dielectric layers 408. The number of the pairs of gate conductive layers 406 and gate-to-gate dielectric layers 408 in memory stack 404 can determine the number of memory cells 306 in memory cell array 301. Gate conductive layer 406 can include conductive materials including, but not limited to, tungsten (W), cobalt (Co), copper (Cu), aluminum (Al), polysilicon, doped silicon, silicides, or any combination thereof. In some implementations, each gate conductive layer 406 includes a metal layer, such as a tungsten layer. In some implementations, each gate conductive layer 406 includes a doped polysilicon layer. Each gate conductive layer 406 can include the control gates of memory cells 306, the gates of DSG transistors 312, or the gates of SSG transistors 310, and can extend laterally as DSG line 313 in the upper portion of memory stack 404, SSG line 315 in the lower portion of memory stack 404, or word line 318 between DSG line 313 and SSG line 315. It is understood that although one SSG line 315 and one DSG line 313 are shown in FIG. 4A, the number of SSG lines 315 and the number of DSG lines 313 (as well as the numbers of SSG transistors 310 and DSG transistors 312 coupled to the SSG lines 315 and DSG lines 313, respectively) may vary in other examples.

As shown in FIG. 4A, NAND memory string 308 includes a channel structure 412 extending vertically through memory stack 404. In some implementations, channel structure 412 includes a channel opening filled with semiconductor material(s) (e.g., as a semiconductor channel 420) and dielectric material(s) (e.g., as a memory film 418). In some implementations, semiconductor channel 420 includes silicon, such as polysilicon. In some implementations, memory film 418 is a composite dielectric layer including a tunneling layer 426, a storage layer 424 (also known as a "charge trap layer"), and a blocking layer 422. Channel structure 412 can have a cylinder shape (e.g., a pillar shape). Semiconductor channel 420, tunneling layer 426, storage layer 424, blocking layer 422 are arranged radially from the center toward the outer surface of the pillar in this order, according to some implementations. Tunneling layer 426 can include silicon oxide, silicon oxynitride, or any combination thereof. Storage layer 424 can include silicon nitride, silicon oxynitride, silicon, or any combination thereof. Blocking layer 422 can include silicon oxide, silicon oxynitride, high dielectric constant (high-k) dielectrics, or any combination thereof. In one example, memory film 418 may include a composite layer of silicon oxide/silicon oxynitride/silicon oxide (ONO).

As shown in FIG. 4A, a well 414 (e.g., a P-well and/or an N-well) is formed in substrate 402, and the source of NAND memory string 308 is in contact with well 414, according to some implementations. For example, source line 314 may be coupled to well 414 to apply an erase voltage to well 414, i.e., the source of NAND memory string 308, during erase operations. In some implementations, NAND memory string 308 further includes a channel plug 416 at the drain end of NAND memory string 308, e.g., as part of the drain of NAND memory string 308. It is understood that the structure of channel structure 412 depicted in FIG. 4A is for illustrative purposes only and may vary in other examples.

As shown in the plan view of FIG. 4B, NAND memory strings 308 of memory cell array 301 can be arranged into blocks 304 by slit structures 430 (e.g., gate line slits (GLSs)), which electrically separate word lines 318 between adjacent blocks 304, such that each block 304 can be individually controlled in read, program, and erase operations. In one example, each slit structure 430 may extend along the x-direction (e.g., the word line direction), and multiple blocks 304 may be arranged along the y-direction (e.g., the bit line direction). In some implementations, each block 304 can be further divided into smaller areas 434 by DSG cuts 432 (a.k.a., top select gate (TSG) cuts), which electrically separate DSG lines 313 between adjacent areas 434, such that DSG lines 313 in different areas 434 may be individually controlled in read and program operations. For example, in a program operation, one NAND memory string 308 in one area 434 may be a select NAND memory string by applying a select DSG voltage to a respective DSG line 313 to turn on the respective DSG transistor 312, while another NAND memory string 308 in another area 434 may be an unselect NAND memory string by applying an unselect DSG voltage to a respective DSG line 313 to turn off the respective DSG transistor 312.

Figure 5:
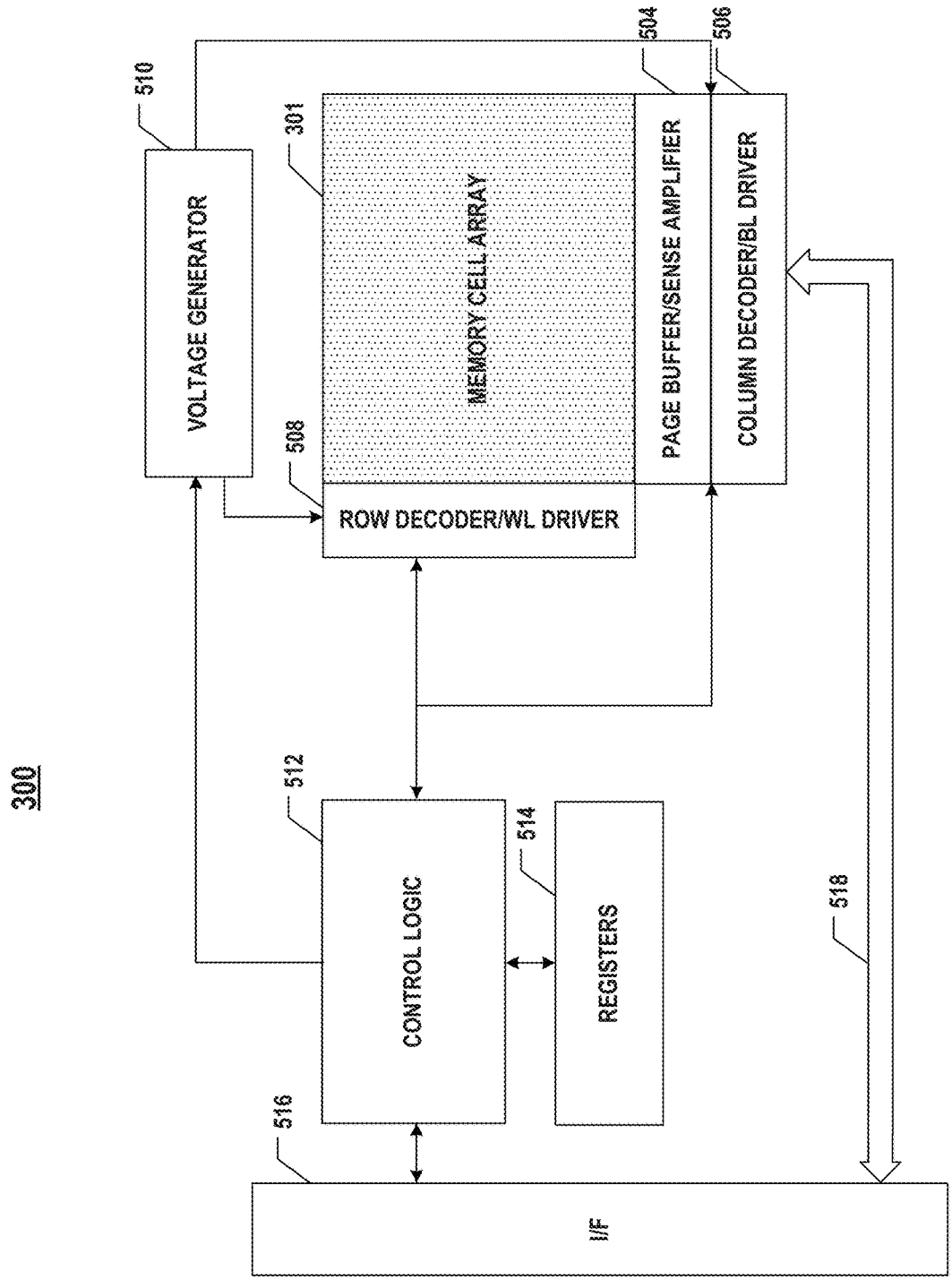
FIG. 5 illustrates a block diagram of a memory device including a memory cell array and peripheral circuits, according to some aspects of the present disclosure.

Referring back to FIG. 3, peripheral circuits 302 can be coupled to memory cell array 301 through bit lines 316, word lines 318, source lines 314, SSG lines 315, and DSG lines 313. Peripheral circuits 302 can include any suitable analog, digital, and mixed-signal circuits for facilitating the operations of memory cell array 301 by applying and sensing voltage signals and/or current signals to and from each target (select) memory cell 306 through bit lines 316, word lines 318, source lines 314, SSG lines 315, and DSG lines 313. Peripheral circuits 302 can include various types of peripheral circuits formed using metal-oxide-semiconductor (MOS) technologies. For example, FIG. 5 illustrates some exemplary peripheral circuits including a page buffer/sense amplifier 504, a column decoder/bit line driver 506, a row decoder/word line driver 508, a voltage generator 510, control logic 512, registers 514, an interface 516, and a data bus 518. It is understood that in some examples, additional peripheral circuits not shown in FIG. 5 may be included as well.

Page buffer/sense amplifier 504 can be configured to read and program (write) data from and to memory cell array 301 according to the control signals from control logic 512. In one example, page buffer/sense amplifier 504 may store one page of program data (write data) to be programmed into one page 320 of memory cell array 301. In another example, page buffer/sense amplifier 504 may sense the signals (e.g., current) from bit line 316 to verify whether each memory cell 306 coupled to selected word lines 318 has been properly programmed into the desired state and count the number of memory cells 306 that pass or fail the verification. In still another example, page buffer/sense amplifier 504 may also sense the signals (e.g., current) from bit line 316 that represents a data bit stored in memory cell 306 and amplify the small voltage swing to recognizable levels in a read operation.

Consistent with the scope of the present disclosure, in some implementations, page buffer/sense amplifier 504 is configured to count the number of times that the threshold voltage of a memory cell 306 of memory cells 306 coupled to selected word lines 318 is in a particular range, for example, between a reference voltage and a specific voltage, when performing dynamic AVD. For example, page buffer/sense amplifier 504 may be configured to pre-charge different groups of bit lines 316 for different sense develop times, thereby affecting different read voltage levels applied to memory cells 306 coupled to different groups of bit lines 316. In some implementations, page buffer/sense amplifier 504 is also configured to identify each memory cell 306 that has a threshold voltage smaller than the reference voltage and inhibit the identified memory cells 306 in counting the number of times when performing dynamic AVD.

Column decoder/bit line driver 506 can be configured to be controlled by control logic 512 and select one or more NAND memory strings 308 by applying bit line voltages generated from voltage generator 510. Row decoder/word line driver 508 can be configured to be controlled according to the control signals by control logic 512 and select/unselect blocks 304 of memory cell array 301 and select/unselect word lines 318 of block 304. Row decoder/word line driver 508 can be further configured to drive word lines 318 using word line voltages generated from voltage generator 510. In some implementations, row decoder/word line driver 508 can also select/unselect and drive SSG lines 315, and DSG lines 313 as well using SSG voltages and DSG voltages generated from voltage generator 510.

Voltage generator 510 can be configured to be controlled by control logic 512 and generate the various word line voltages (e.g., read voltage, program voltage, pass voltage, verify voltage), SSG voltages (e.g., select/unselect voltages), DSG voltages (e.g., select/unselect voltages), bit line voltages (e.g., ground voltage), and source line voltages (e.g., ground voltage) to be supplied to memory cell array 301.

Control logic 512 can be coupled to each peripheral circuit described above and configured to control the operations of each peripheral circuit. Registers 514 can be coupled to control logic 512 and include status registers, command registers, and address registers for storing status information, command operation codes (OP codes), and command addresses for controlling the operations of each peripheral circuit. In some implementations, control logic 512 can receive a read command issued by a memory controller (e.g., memory controller 106 in FIG. 1) and send control signals to various peripheral circuits, such as row decoder/word line driver 508, column decoder/bit line driver 506, and voltage generator 510 to initiate the read operation on target memory cells 306 coupled to selected word line 318. In some implementations, control logic 512 can receive an AVD command issued by a memory controller (e.g., memory controller 106 in FIG. 1) and send control signals to various peripheral circuits, such as row decoder/word line driver 508, page buffer/sense amplifier 504, and control logic 512 itself to estimate a valley voltage corresponding to one of the states of memory cells 306. Consistent with the scope of the present disclosure, control logic 512 can compare the numbers of different sets of memory cells 306 having threshold voltages between the centers of two adjacent distributions of threshold voltages, and estimate the valley voltage at the valley between the two adjacent distributions based on the comparison result. In some implementations, control logic 512 further determines optimal read voltages corresponding to other states based on the estimated valley voltage and default read voltages, and send control signals to various peripheral circuits, such as row decoder/word line driver 508, column decoder/bit line driver 506, and voltage generator 510 to initiate the read operation on target memory cells 306 coupled to selected word line 318 using the optimal read voltages to dynamically compensate for the threshold voltage distribution shift due to retention charge loss or other phenomena.

Interface 516 can be coupled to control logic 512 and act as a control buffer to buffer and relay control commands (e.g., read command or AVD command) received from a memory controller (e.g., memory controller 106 in FIG. 1) to control logic 512 and status information (e.g., the estimated valley voltage or the read level offset thereof) received from control logic 512 to the memory controller. Interface 516 can also be coupled to column decoder/bit line driver 506 via data bus 518 and act as a data input/output (I/O) interface and a data buffer to buffer and relay the data to and from memory cell array 301.

Figure 6:
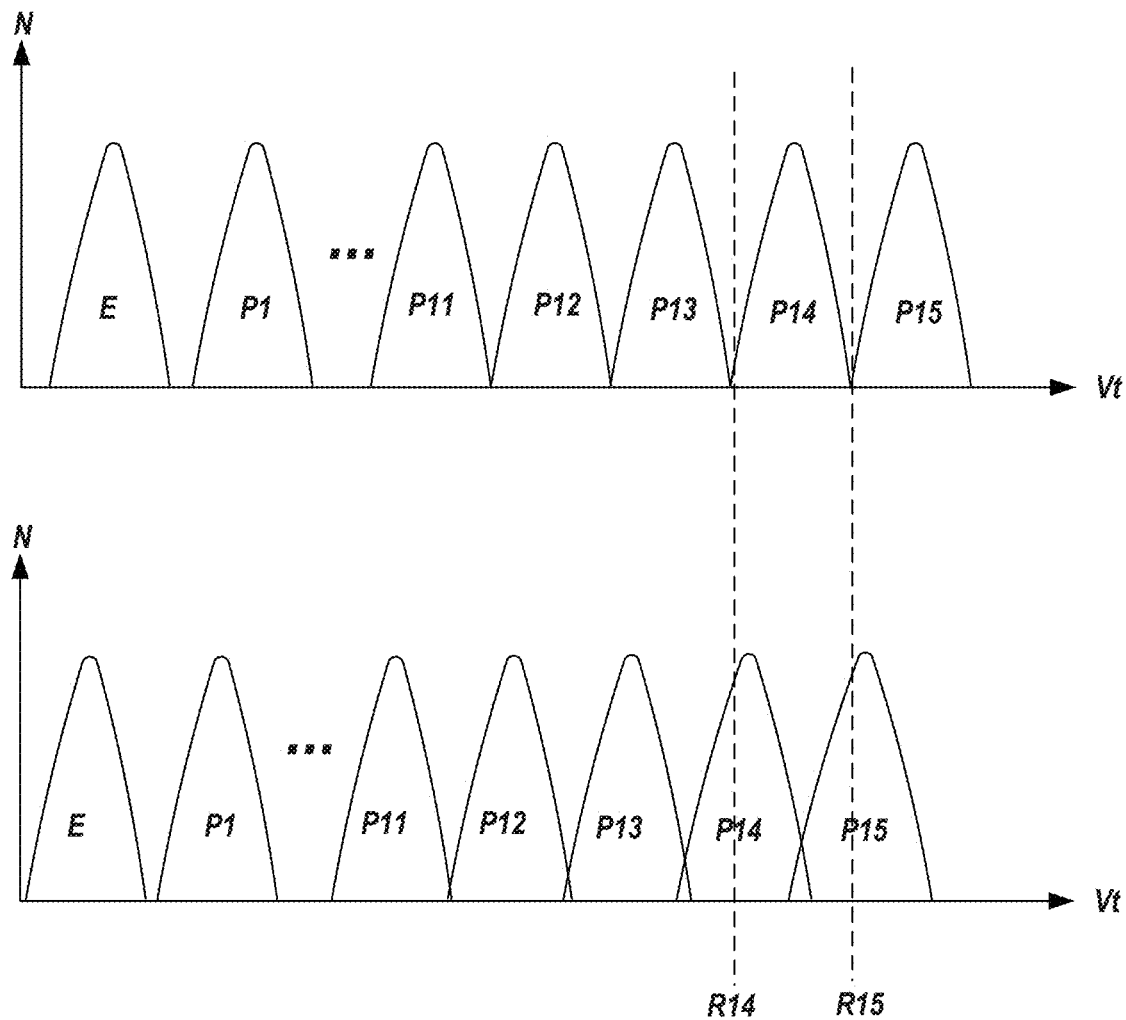
FIG. 6 illustrates the shift of threshold voltage distributions of memory cells due to retention charge loss, according to some aspects of the present disclosure.

FIG. 6 illustrates the shift of threshold voltage distributions of memory cells 306 due to retention charge loss, according to some aspects of the present disclosure. Each memory cell 306 can store a piece of N-bits data in one of $2^N$ states, where N is an integer greater than 1 (e.g., N=2 for MLCs, N=3 for TLCs, N=4 for QLCs, etc.). In other words, each memory cell 306 is in one of $2^N$ states, according to some implementations. Taking QLCs, where N=4, for example, memory cell 306 may be in one of the 16 levels, including one erased state (E) and 15 programmed states (P1-P15), as shown in FIG. 6. Each state can correspond to one of $2^N$ threshold voltage (Vt) distributions of memory cells 306. That is, the threshold voltages of memory cells 306 have $2^N$ distributions corresponding to $2^N$ states, respectively, according to some implementations. For example, the state corresponding to the lowest threshold voltage distribution (e.g., E, the left-most threshold voltage distribution in FIG. 6) may be considered as state 0, the state corresponding to the second-lowest threshold voltage distribution (e.g., P1, the second left-most threshold voltage distribution in FIG. 6) may be considered as state 1, and so until state 15 corresponding to the highest threshold voltage distribution (e.g., P15, the right-most threshold voltage distribution in FIG. 6).

Thus, to differentiate two adjacent states of memory cells 306 in read operations, the read voltage(s) can be set between some of the adjacent threshold voltage distributions depending on the gray code. To minimize read errors, the read voltages should be set at the valleys between adjacent distributions. For example, as shown in the upper diagram of FIG. 6, which is obtained, for example, from chip trim right after manufacturing, a default read voltage (R15) corresponding to state 15 (e.g., that can differentiate adjacent states 14 and 15) may be set at the valley between adjacent distributions P14 and P15, and another default read voltage (R14) corresponding to state 14 (e.g., that can differentiate adjacent states 13 and 14) may be set at the valley between adjacent distributions P13 and P14.

However, memory cells 306, e.g., NAND Flash memory cells, may tend to lose charge with time, i.e., retention charge loss. Due to retention charge loss, the threshold voltage distributions of memory cells 306 may shift negatively/lower (e.g., down to the left in FIG. 6) as time goes by. As a result, the default read voltages (e.g., R14 and R15) that are set based on the threshold voltage distributions of memory cell 306 obtained, for example, from chip trim right after manufacturing may no longer be at the valleys (e.g., as shown in the lower diagram of FIG. 6) and thus, may increase read errors in read operations. Retention charge loss can widen the threshold voltage distributions and narrow the valleys therebetween as well (e.g., as shown in the lower diagram of FIG. 6), thereby further increasing the read errors with the default read voltages. Besides retention, other phenomena, such as the back pattern effect, can also shift the threshold voltage distributions and the valleys therebetween, for example, in open blocks, which further make the default read voltages undesirable in read operations. The threshold voltage distributions corresponding to higher states (e.g., P14 and P15) shift more than the threshold voltage distributions corresponding to lower states.

As a result, consistent with the scope of the present disclosure, an offset from each default read voltage needs to be applied to compensate for the threshold voltage distributions shift due to retention, back pattern effect, and/or any other phenomena, thereby optimizing the read voltages in subsequent read operations. The read voltage offset can be determined based on the shift of the valleys, in particular, between the higher distributions (e.g., P14 and P15), by estimating the valley voltage (e.g., in the lower diagram of FIG. 6) using dynamic AVD schemes disclosed below in detail.

Figure 7:
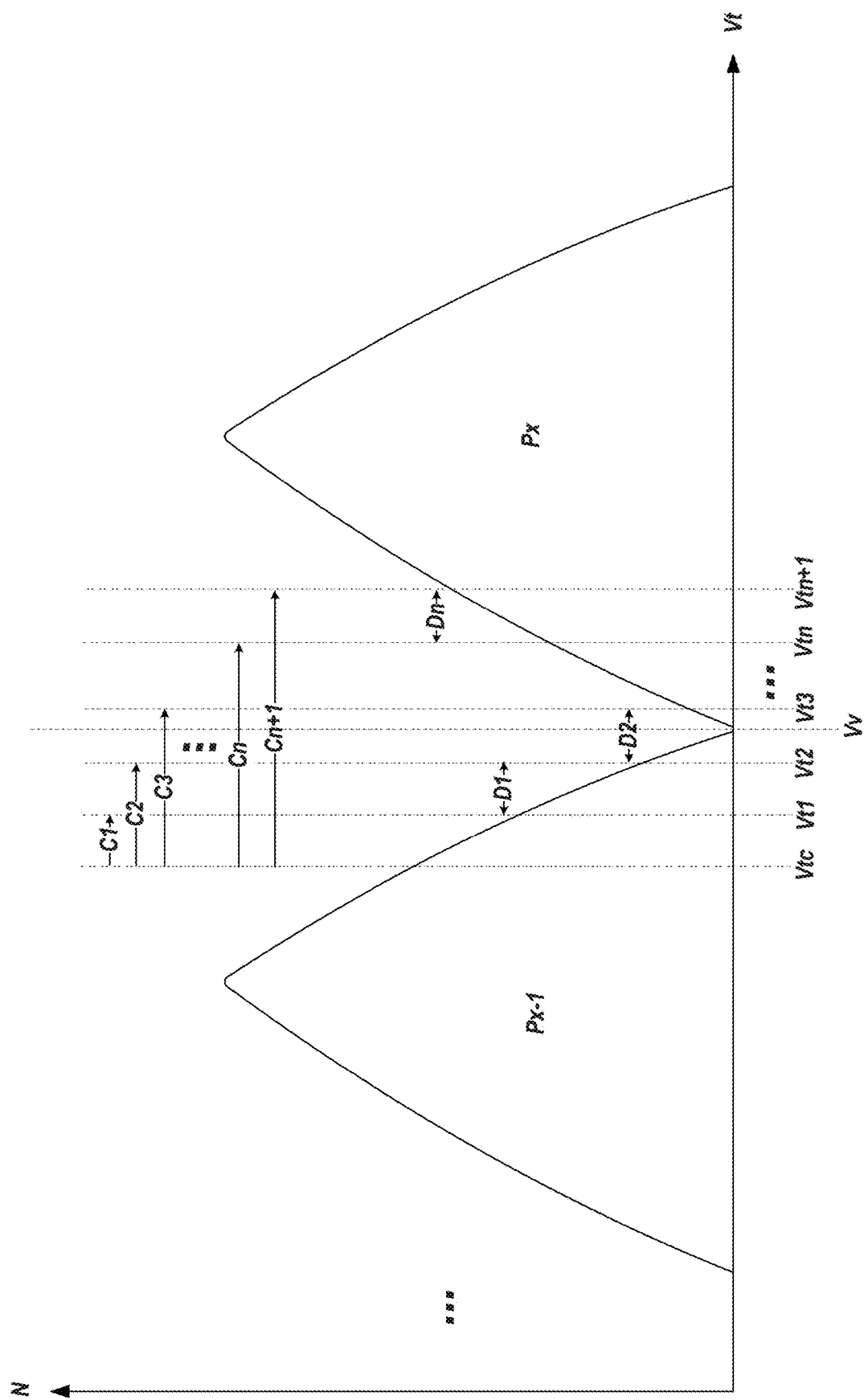
FIG. 7 illustrates a scheme of dynamic automatic valley detection (AVD), according to some aspects of the present disclosure.

FIG. 7 illustrates a scheme of dynamic AVD, according to some aspects of the present disclosure. As shown in FIG. 7, dynamic AVD can be performed to dynamically determine the valley between two adjacent distributions Px and Px−1 by estimating the threshold voltage at the valley (referred to herein as "valley voltage" Vv) corresponding to state x, where x=1, 2, 3, . . . , $2^N-1$. To estimate the valley voltage Vv, a plurality of threshold voltages Vt1, Vt2, Vt3, . . . , Vtn, and Vtn+1 between the centers (e.g., corresponding to the mean of each distribution) of the two adjacent distributions Px and Px−1 can be used to define a plurality of threshold voltage intervals, i.e., [Vt1, Vt2], [Vt2, Vt3], [Vtn, Vtn+1]. In some implementations, the threshold voltage intervals have the same range of threshold voltages (referred to herein as "unit threshold voltage interval"), i.e., [Vt1, Vt2]=[Vt2, Vt3]==[Vtn, Vtn+1]. Memory cells 306 coupled to selected word line 318 can thus include a plurality sets, each falling into a respective one of the unit threshold voltage intervals. To estimate the valley voltage Vv, for each unit threshold voltage interval, the number D of a respective set of memory cells 306 coupled to selected word line 318 can be determined. By comparing the numbers D1, D2, . . . , Dn of sets of memory cells 306 in the unit threshold voltage intervals between the centers of the two adjacent distributions Px and Px−1, the trend (e.g., ascending or descending) of the distribution curve can be revealed, which can be used as the basis to estimate the valley voltage Vv.

For example, in general, for two adjacent unit threshold voltage intervals, if the number of the set of memory cells 306 in the higher unit threshold voltage interval (i.e., more toward the right of the diagram in FIG. 7) is smaller than the number of the set of memory cells 306 in the lower unit threshold voltage interval (i.e., more toward the left of the diagram in FIG. 7), then the distribution curve descends from the lower unit threshold voltage interval to the higher unit threshold voltage interval, meaning that the two unit threshold voltage intervals are between the center of the lower distribution Px−1 and the valley; if the number of the set of memory cells 306 in the higher unit threshold voltage interval (i.e., more toward the right of the diagram in FIG. 7) is larger than the number of the set of memory cells 306 in the lower unit threshold voltage interval (i.e., more toward the left of the diagram in FIG. 7), then the distribution curve ascends from the lower unit threshold voltage interval to the higher unit threshold voltage interval, meaning that the two unit threshold voltage intervals are between the valley and the center of the higher distribution Px; if the number of the set of memory cells 306 in the higher unit threshold voltage interval (i.e., more toward the right of the diagram in FIG. 7) is the same as the number of the set of memory cells 306 in the lower unit threshold voltage interval (i.e., more toward the left of the diagram in FIG. 7), then the distribution curve passes across the valley, meaning that the valley is between the two unit threshold voltage intervals. It is understood that the number of the set of memory cells 306 in the higher unit threshold voltage interval may still be considered to be the same as the number of the set of memory cells 306 in the lower unit threshold voltage interval if the difference between the two numbers is not greater than 1% of the smaller one of the two numbers in the present disclosure.

It is understood that the number D of the set of memory cells 306 in each unit threshold voltage interval between the centers of the two adjacent distributions Px and Px−1 may not be able to be counted directly by peripheral circuits 302 in some examples. Instead, as shown in FIG. 7, a plurality of threshold voltage intervals with respect to the same reference threshold voltage Vtc (referred to herein as "reference threshold voltage intervals") can be used for counting the corresponding numbers C of memory cells 306, and the differences between the numbers C of memory cells 306 in reference threshold voltage intervals can be used to calculate the numbers D of the sets of memory cells 306 in unit threshold voltage intervals.

In some implementations, the reference voltage Vtc is within one of the two adjacent distributions (e.g., the lower distribution) and is smaller than the lowest one of the threshold voltages between the centers of the two adjacent distributions. For example, as shown in FIG. 7, the reference threshold voltage Vtc may be set within the lower distribution Px−1, and the reference threshold voltage intervals [Vtc, Vt1], [Vtc, Vt2], [Vtc, Vt3], . . . , [Vtc, Vtn], and Vtc, Vtn+1] may be defined between the reference threshold voltage Vtc and each of the threshold voltages Vt1, Vt2, Vt3, . . . , Vtn, and Vtn+1 between the centers of the two adjacent distributions Px and Px−1. The numbers C1, C2, C3, . . . , Cn, and Cn+1 of memory cells 306 in the reference threshold voltage intervals [Vtc, Vt1 [Vtc, Vt2], [Vtc, Vt3], . . . , [Vtc, Vtn], and Vtc, Vtn+1], respectively, may be counted by peripheral circuits 302 as described below in detail. The numbers D1, D2, . . . , Dn of sets of memory cells 306 in the unit threshold voltage intervals [Vt1, Vt2], [Vt2, Vt3], . . . , [Vtn, Vtn+1] may be calculated based on the differences between the numbers C1, C2, C3, . . . , Cn, and Cn+1 of memory cells 306 in the reference threshold voltage intervals [Vtc, Vt1], [Vtc, Vt2], [Vtc, Vt3], . . . , [Vtc, Vtn], and Vtc, Vtn+1]. In one example, the number D1 in the unit threshold voltage intervals [Vt1, Vt2] may be equal to the difference between the number C2 in the reference threshold voltage interval [Vtc, Vt2] and the number C1 in the reference threshold voltage interval [Vtc, Vt1], i.e., D1=C2−C1. In another example, the number D2 in the unit threshold voltage intervals [Vt2, Vt3] may be equal to the difference between the number C3 in the reference threshold voltage interval [Vtc, Vt3] and the number C2 in the reference threshold voltage interval [Vtc, Vt2], i.e., D2=C3−C2. In still another example, the number Dn in the unit threshold voltage intervals [Vtn+1, Vtn] may be equal to the difference between the number Cn+1 in the reference threshold voltage interval [Vtc, Vtn+1] and the number Cn in the reference threshold voltage interval [Vtc, Vtn], i.e., Dn=Cn+1−Cn.

It is understood that the reference threshold voltage Vtc is not limited by the example shown in FIG. 7 (i.e., between the center of the lower distribution Px−1 and the valley) and may be any threshold voltage that is smaller than the threshold voltages Vt1, Vt2, Vt3, . . . , Vtn, and Vtn+1 between the centers of the two adjacent distributions Px and Px−1, for example, smaller than the center of the lower distribution Px−1. In some examples, the reference threshold voltage may be at the origin of the diagram in FIG. 7, such as 0 voltage or corresponding to the lowest state (i.e., the erased state E). By adjusting the reference threshold voltage, the ranges of the reference threshold voltage intervals and the corresponding numbers C of memory cells 306 can be adjusted accordingly. For example, the larger the reference threshold voltage is, the smaller the numbers C of memory cells 306 may need to be counted. In some implementations, by setting the reference threshold voltage Vtc between the center of the lower distribution Px−1 and the valley as shown in FIG. 7, the number C of memory cells 306 that need to be counted is reduced, thereby reducing the noise and errors.

It is further understood that the number of unit threshold voltage intervals and/or the range of the unit threshold voltage intervals used for estimating the valley voltage may vary in different examples. In one example, the more the unit threshold voltage intervals are used, the more accurate the estimation of the valley voltage may be. In another example, the smaller each unit threshold voltage interval is, the more accurate the estimation of the valley voltage may be. On the other hand, the more the unit threshold voltage intervals are used and/or the smaller each unit threshold voltage interval is, the longer duration the dynamic AVD may take. Regarding the number of unit threshold voltage intervals, at least two unit threshold voltage intervals need to be used in dynamic AVD, according to some implementations. For example, FIGS. 8A-8C illustrate a detailed example of a dynamic AVD scheme using two unit threshold voltage intervals, according to some aspects of the present disclosure.

Figure 8A:
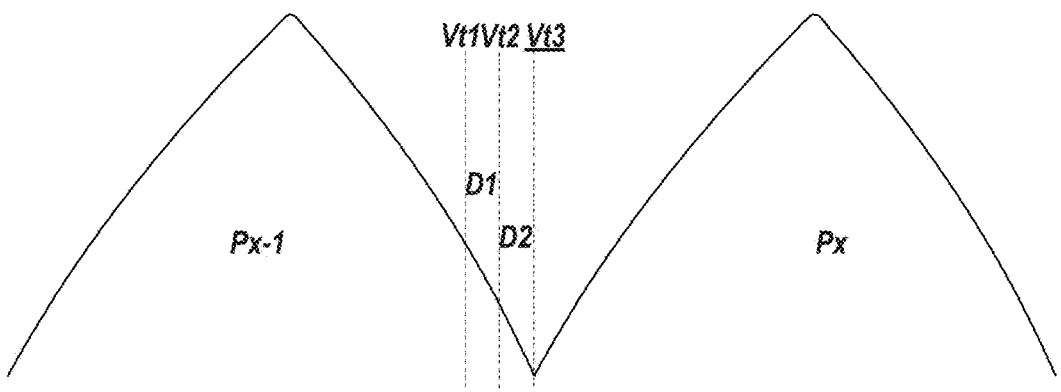
FIGS. 8A-8C illustrate a detailed example of a dynamic AVD scheme, according to some aspects of the present disclosure.

As shown in FIG. 8A, a first number D1 of a first set of memory cells 306 coupled to selected word line 318 may be determined. The threshold voltages of the first set of memory cells 306 may be in a first unit threshold voltage interval between a first voltage Vt1 and a second voltage Vt2 larger than the first voltage Vt1. A second number D2 of a second set of memory cells 306 coupled to selected word line 318 may be determined as well. The threshold voltages of the second set of memory cells 306 may be in a second unit threshold voltage interval between the second voltage Vt2 and a third voltage Vt3 larger than the second voltage Vt2.

The valley voltage may be equal to or larger than the third voltage Vt3 when the first number D1 is larger than the second number D2, which indicates that the first and second unit threshold voltage intervals are between the center of the lower distribution Px−1 and the valley. In one example as shown in FIG. 8A, the valley voltage may be equal to the third voltage Vt3. In another example when the first and second unit threshold voltage intervals are lower than those shown in FIG. 8A, the valley voltage may be larger than the third voltage Vt3. In this case, one or more unit threshold voltage intervals higher than the second unit threshold voltage interval may be used to further estimate the valley voltage.

Figure 8B:
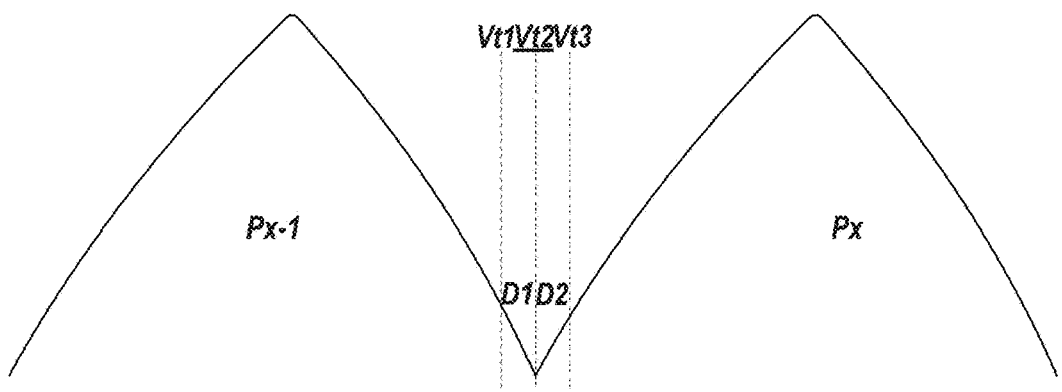
Figure 8C:
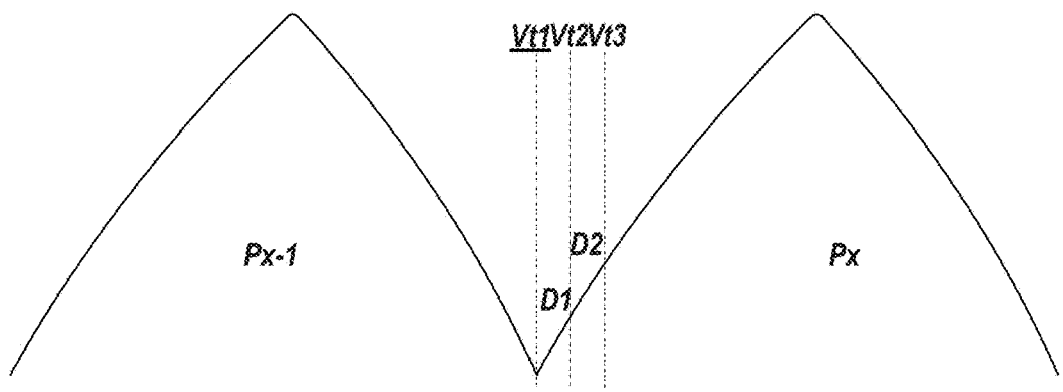

As shown in FIG. 8B, the valley voltage may be equal to the second voltage Vt2 when the first number D1 is the same as the second number D2, which indicates that the valley is between the first and second unit threshold voltage intervals. It is understood that the first number D1 may still be considered to be the same as the second number D2 if the difference between the D1 and D2 is not greater than 1% of the smaller one of D1 and D2.

The valley voltage may be equal to or smaller than the first voltage Vt1 when the first number D1 is smaller than the second number D2, which indicates that the first and second unit threshold voltage intervals are between the valley and the center of the higher distribution Px. In one example as shown in FIG. 8C, the valley voltage may be equal to the third voltage Vt1. In another example when the first and second unit threshold voltage intervals are higher than those shown in FIG. 8C, the valley voltage may be smaller than the first voltage Vt1. In this case, one or more unit threshold voltage intervals lower than the first unit threshold voltage interval may be used to further estimate the valley voltage.

As described above, more than two unit threshold voltage intervals may be used to further increase the accuracy of the dynamic AVD. For example, FIGS. 8D-8G illustrate another detailed example of a dynamic AVD scheme using three unit threshold voltage intervals, according to some aspects of the present disclosure.

Figure 8D:
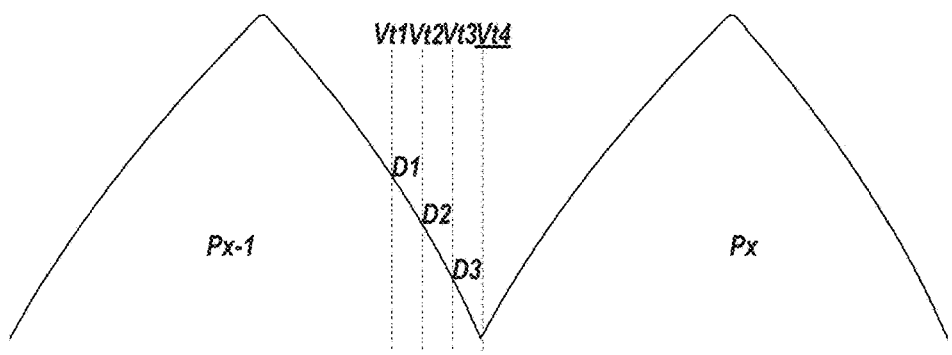
FIGS. 8D-8G illustrate another detailed example of a dynamic AVD scheme, according to some aspects of the present disclosure.

As shown in FIG. 8D, a first number D1 of a first set of memory cells 306 coupled to selected word line 318 may be determined. The threshold voltages of the first set of memory cells 306 may be in a first unit threshold voltage interval between a first voltage Vt1 and a second voltage Vt2 larger than the first voltage Vt1. A second number D2 of a second set of memory cells 306 coupled to selected word line 318 may be determined. The threshold voltages of the second set of memory cells 306 may be in a second unit threshold voltage interval between the second voltage Vt2 and a third voltage Vt3 larger than the second voltage Vt2. A third number D3 of a third set of memory cells 306 coupled to selected word line 318 may be determined as well. The threshold voltages of the third set of memory cells 306 may be in a third unit threshold voltage interval between the third voltage Vt3 and a fourth voltage Vt4 larger than the third voltage Vt3.

The valley voltage may be equal to or larger than the fourth voltage Vt4 when the first number D1 is larger than the second number D2, and the second number D2 is larger than the third number D3 (D1>D2>D3), which indicates that the first, second, and third unit threshold voltage intervals are between the center of the lower distribution Px−1 and the valley. In one example as shown in FIG. 8D, the valley voltage may be equal to the fourth voltage Vt4. In another example when the first, second, and third unit threshold voltage intervals are lower than those shown in FIG. 8D, the valley voltage may be larger than the fourth voltage Vt4. In this case, one or more unit threshold voltage intervals higher than the third unit threshold voltage interval may be used to further estimate the valley voltage.

Figure 8E:
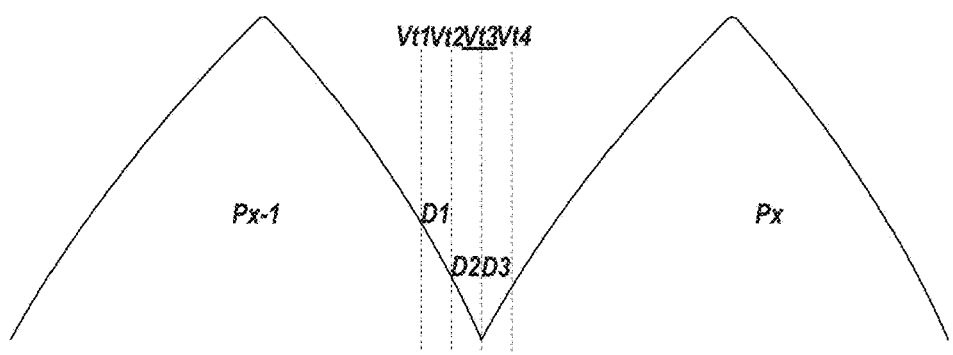

As shown in FIG. 8E, the valley voltage may be equal to the third voltage Vt3 when the first number D1 is larger than the second number D2, and the second number D2 is the same as the third number D3 (D1>D2=D3), which indicates that the first and second unit threshold voltage intervals are between the center of the lower distribution Px−1 and the valley, and the valley is between the second and third unit threshold voltage intervals. It is understood that the second number D2 may still be considered to be the same as the third number D3 if the difference between the D2 and D3 is not greater than 1% of the smaller one of D2 and D3.

Figure 8F:
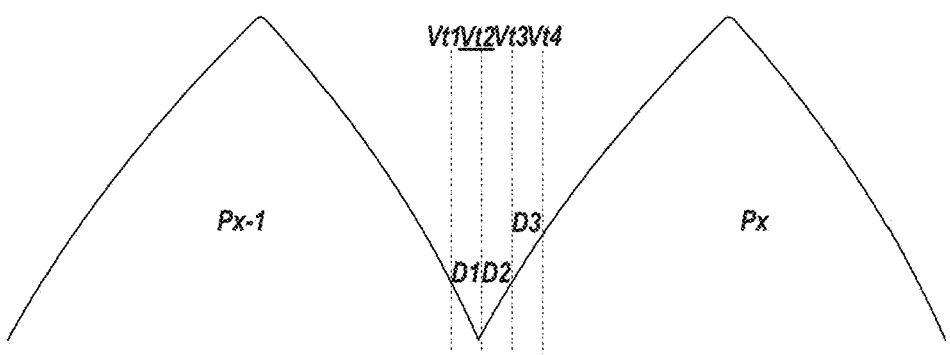

As shown in FIG. 8F, the valley voltage may be equal to the second voltage Vt2 when the first number D1 is the same as the second number D2, and the second number D2 is smaller than the third number D3 (D1=D2<D3), which indicates that the valley is between the first and second unit threshold voltage intervals, and the second and third unit threshold voltage intervals are between the valley and the center of the higher distribution Px. It is understood that the first number D1 may still be considered to be the same as the second number D2 if the difference between the D1 and D2 is not greater than 1% of the smaller one of D1 and D2.

Figure 8G:
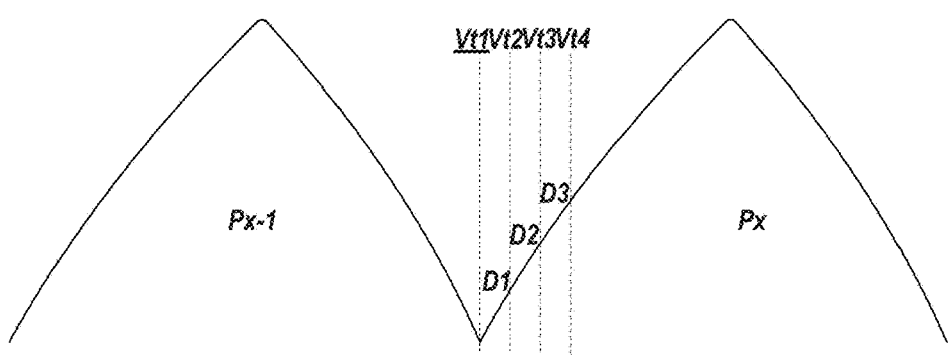

The valley voltage may be equal to or smaller than the first voltage Vt1 when the first number D1 is smaller than the second number D2, and the second number D2 is smaller than the third number D3 (D1<D2<D3), which indicates that the first, second, and third unit threshold voltage intervals are between the valley and the center of the higher distribution Px. In one example as shown in FIG. 8G, the valley voltage may be equal to the first voltage Vt1. In another example when the first, second, and third unit threshold voltage intervals are higher than those shown in FIG. 8G, the valley voltage may be smaller than the first voltage Vt1. In this case, one or more unit threshold voltage intervals lower than the first unit threshold voltage interval may be used to further estimate the valley voltage.

Figure 9:
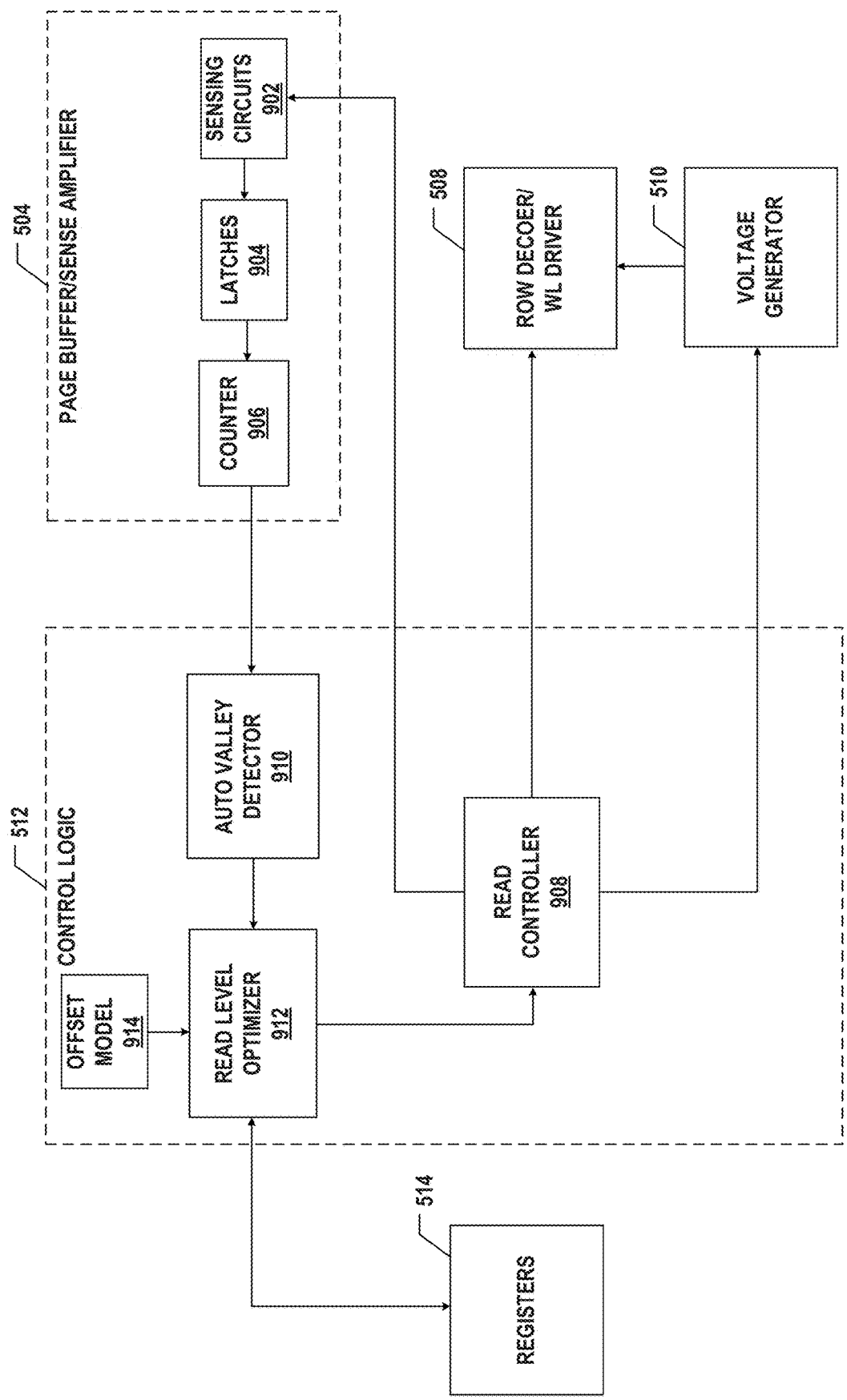
FIG. 9 illustrates a detailed block diagram of control logic and a page buffer/sense amplifier of the memory device in FIG. 3, according to some aspects of the present disclosure.

FIG. 9 illustrates a detailed block diagram of control logic 512 and page buffer/sense amplifier 504 of memory device 300 in FIG. 3, according to some aspects of the present disclosure. In some implementations, peripheral circuits 302, including control logic 512, row decoder/word line driver 508, voltage generator 510, page buffer/sense amplifier 504, registers 514, and any other suitable components (e.g., column decoder/bit line driver 506) work together to perform dynamic AVD on memory cells 306 (e.g., QLCs) in memory cell array 301 coupled to a selected word line 318 (e.g., page 320). To perform the dynamic AVD, page buffer/sense amplifier 504 can include sensing circuits 902, latches 904, and a counter 906, along with any other suitable components not shown in FIG. 9, such as other data and cache latches. Each of sensing circuits 902, latches 904, and counter 906 can be a digital circuit, an analog circuit, and/or a mixed-signal circuit, as described below in more detail. To perform the dynamic AVD, control logic 512 can include an auto valley detector 910, a read level optimizer 912, and a read controller 908, along with any other suitable components not shown in FIG. 8, such as one or more processors (e.g., microcontroller units (MCUs)) and a memory (e.g., random-access memory (RAM)). Each of auto valley detector 910, read level optimizer 912, and read controller 908 can be implemented as a firmware module stored in the RAM and executed by the MCU. Each of auto valley detector 910, read level optimizer 912, and read controller 908 can also be implemented as application-specific integrated circuits (ASICs), including a digital circuit, an analog circuit, and/or a mixed-signal circuit.

As shown in FIGS. 3, 5, and 9, peripheral circuits 302 can be configured to determine the number D of each set of memory cells 306 coupled to selected word line 318 in a respective unit threshold voltage interval, e.g., between two threshold voltages that are between centers of two adjacent distributions of the threshold voltages. In some implementations, peripheral circuits 302 are configured to determine a first number of a first set of the memory cells 306 and a second number of a second set of memory cells 306. The threshold voltages of the first set of memory cells 306 are between a first voltage and a second voltage larger than the first voltage (i.e., in a lower unit threshold voltage interval), and the threshold voltages of the second set of the memory cells 306 are between the second voltage and a third voltage larger than the second voltage (i.e., in a higher unit threshold voltage interval adjacent to the lower unit threshold voltage interval). The threshold voltages of memory cells 306 coupled to selected word line 318 can have a plurality of distributions corresponding to the states of memory cells 306, respectively, and the first, second, and third voltages can be set between the centers of the two adjacent distributions. As unit threshold voltage intervals, the difference between the second voltage and the first voltage is the same as the difference between the third voltage and the second voltage, according to some implementations. It is understood that in some examples, peripheral circuits 302 may be configured to determine the number(s) of additional sets of memory cells 306 in additional unit threshold voltage interval(s) as described above, for example, with respect to FIGS. 8D-8G.

In some implementations, to determine the numbers D of sets of memory cells 306 in unit threshold voltage intervals, page buffer/sense amplifier 504 of peripheral circuits 302 is coupled to memory cells 306 through bit lines 316, respectively, and configured to count the number of times C that a threshold voltage of a memory cell 306 is in a respective reference threshold voltage interval, e.g., in the range between a reference voltage and a respective voltage. In some implementations, page buffer/sense amplifier 504 is configured to count a first number of times that a threshold voltage of a memory cell 306 is in the range between the reference voltage and the first voltage (i.e., in a lower reference threshold voltage interval), count a second number of times that a threshold voltage of a memory cell 306 is in the range between the reference voltage and the second voltage (i.e., in a middle reference threshold voltage interval), and count a third number of times that a threshold voltage of a memory cell 306 is in the range between the reference voltage and the third voltage (i.e., in a higher reference threshold voltage interval). The reference voltage can be within one of the two adjacent distributions, for example, the lower distribution, and can be smaller than the first voltage. It is understood that in some examples, the reference voltage may be outside of the two adjacent distributions, for example, smaller than the lower distribution of the two adjacent distributions. For example, the reference voltage may be 0 V or within the lowest distribution corresponding to the lowest state, e.g., the erased state.

In some implementations, to determine the numbers D of sets of memory cells 306 in unit threshold voltage intervals, auto valley detector 910 of control logic 512 is configured to receive the counted numbers of times C from page buffer/sense amplifier 504 and calculate each difference between the counted numbers of times C that are in two adjacent reference threshold voltage intervals as the number D of the set of memory cells 306 in the respective unit threshold voltage interval that is between the two adjacent reference threshold voltage intervals. In some implementations, auto valley detector 910 of control logic 512 is configured to calculate the difference between the second number of times and the first number of times as the first number of the first set of the memory cells 306, and calculate the difference between the third number of times and the second number of times as the second number of the second set of the memory cells 306.

There are various ways to count the numbers of times C in the reference threshold voltage intervals by page buffer/sense amplifier 504. In some implementations, row decoder/word line driver 508 of peripheral circuits 302 that is coupled to memory cells 306 through selected word line 318 is configured to apply a read voltage to word line 318, and each sensing circuit 902 of page buffer/sense amplifier 504 coupled to a respective memory cell 306 through a respective bit line 316 is configured to fully pre-charge the respective bit line 316 to the same setup voltage Vset. Thus, by varying the read voltage between each of the voltages used to define the reference threshold voltage intervals (e.g., the first, second, and third voltages between the centers of the adjacent distributions) in different read operations, each sensing circuit 902 can sense whether the respective memory cell 306 has a threshold voltage larger than the read voltage (i.e., whether it is within in respective reference threshold voltage interval). The sensing result of each sensing circuit 902 (a.k.a., the "fail bit") can be recorded by a respective latch 904, and counted by counter 906 as the number of times C in the respective threshold voltage interval. It is understood that since bit lines 316 coupled to all memory cells 306 coupled to selected word line 318 need to be fully pre-charged to the same setup voltage, the scheme described above may need to perform repeatedly for each of the voltages that are used to define the reference threshold voltage intervals with the reference voltage, which, however, may increase the duration of the dynamic AVD, in particular when the number of reference threshold voltage intervals is relatively large.

On the other hand, since the sense develop time used for pre-charging each bit line 316 by a respective sensing circuit 902 and the resulting setup voltage is correlated with the threshold voltage, and the state pattern of memory cells 306 is a random pattern in NAND Flash memory devices, the numbers of times C in the reference threshold voltage intervals can be counted by page buffer/sense amplifier 504 in parallel on different groups of memory cells 306 coupled to selected word line 318, thereby reducing the duration of the dynamic AVD. For NAND Flash memory devices, since the programming pattern is a random pattern, each group of memory cells 306 coupled to selected word line 318 (e.g., a page 320) may have the same threshold voltage distributions. Based on this assumption, memory cells 306 coupled to selected word line 318 and their respective bit lines 316 can be divided into a plurality of groups, and the counting result of numbers of times C (e.g., the fail bit count) for each group can represent the result of all memory cells 306, thereby enabling parallel counting on the group level.

Moreover, during the read setup stage of a read operation, the sense develop time for pre-charging each bit line 316 and the resulting setup voltage can be individually controlled by a respective sensing circuit 902 of page buffer/sense amplifier 504. Since the sense develop time correlates with the threshold voltage, to enable parallel counting on the group level with different reference threshold voltage intervals, different sense develop times and the resulting setup voltages can be applied to different groups of bit lines 316 (and their respective memory cells 306), respectively, in parallel, which have the same effect of applying different read voltages corresponding to different threshold voltages. For example, a shorter sense develop time may correspond to read at a lower threshold voltage, while a longer sense develop time may correspond to read at a higher threshold voltage. It is understood that the extract correlation between threshold voltages of memory cells 306 and sense develop times may be obtained from existing data and experience, for example, by calibration.

Figure 12:
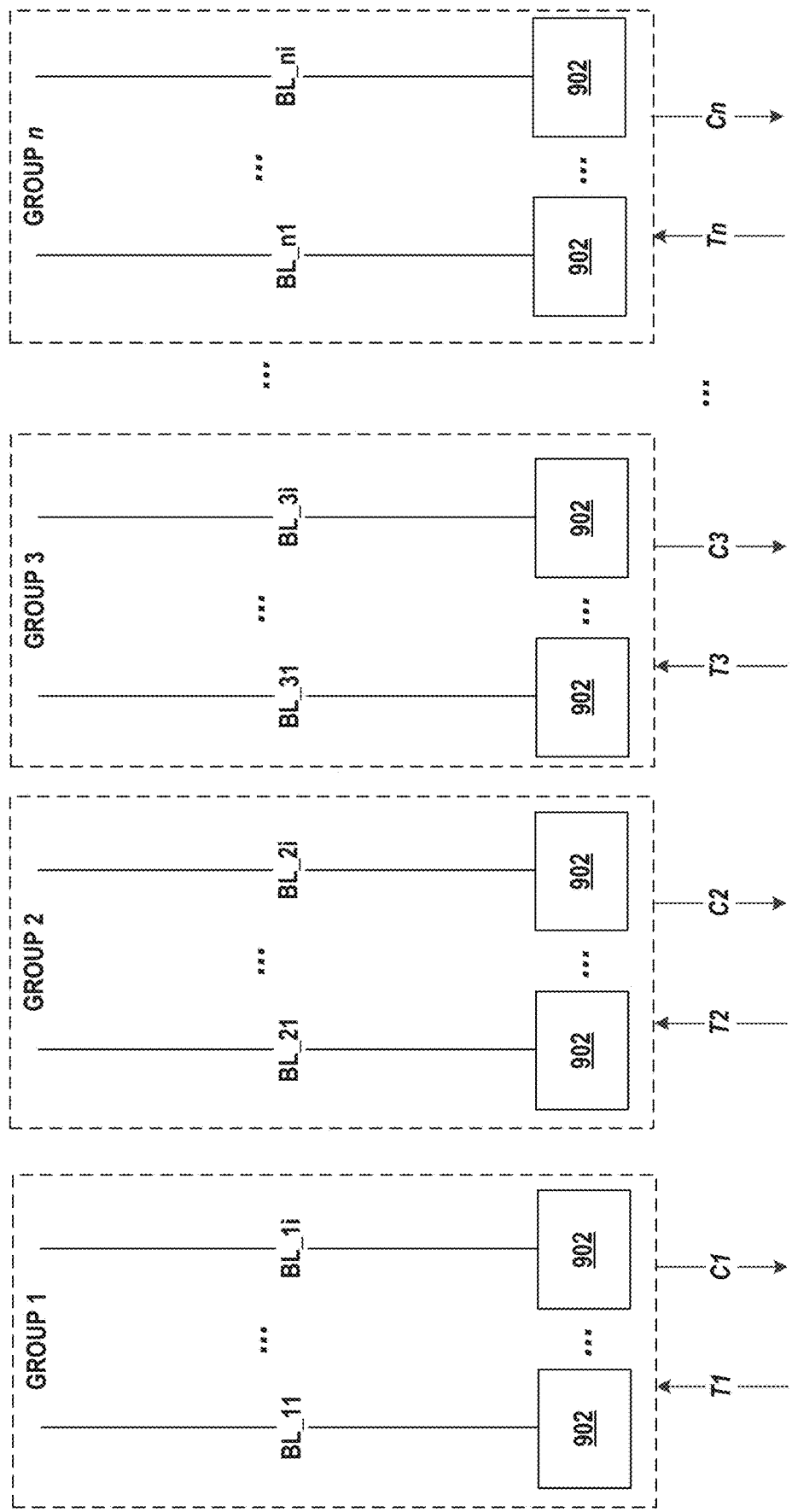
FIG. 12 illustrates a schematic diagram of a dynamic AVD scheme based on varying sense develop times and memory cells grouping, according to some aspects of the present disclosure.

Each memory cell 306 coupled to selected word line 318 (e.g., in one page 320) can be coupled to a respective bit line (BL) 316, which is in turn coupled to a respective sensing circuit 902 of page buffer/sense amplifier 504. As shown in FIG. 12, bit lines 316 (and the respective memory cells 306, not shown) may be divided into n groups (e.g., BL_11 to BL_1i, BL_21 to BL_2i, BL_31 to BL_3i, . . . , BL_n1 to BL_ni), where n is a positive integer greater than 1. In one example, a 16 KB page may be divided into four groups (n=4), each of which has 4 KB bit lines 316 and 4 KB memory cells 306. It is understood that the number of bit lines 316 in each group may vary in some examples. As shown in FIG. 12, different sense develop times T1, T2, T3, . . . , Tn may be applied to different groups 1, 2, 3, . . . , and n of bit lines 316 when pre-charging bit lines 316 during the read setup stage of a read operation. Each group 1, 2, 3, . . . , or n thus may return a respective number of times C1, C2, C3, . . . , or Cn in the respective reference threshold voltage interval.

In some implementations, row decoder/word line driver 508 of peripheral circuits 302 that is coupled to memory cells 306 through selected word line 318 is configured to, during the read setup stage, apply a read voltage Vread to selected word line (SEL WL) 318, and sensing circuits 902 of page buffer/sense amplifier 504 are configured to pre-charge each group of bit lines (BL) 316 for a respective sense develop time. In some implementations, page buffer/sense amplifier 504 is configured to pre-charge a first group of bit lines 316 for a first sense develop time, a second group of bit lines 316 for a second sense develop time, and a third group of bit lines 316 for a third sense develop time. The third sense develop time can be longer than the second sense develop time, and the second sense develop time can be longer than the first sense develop time.

Figure 10:
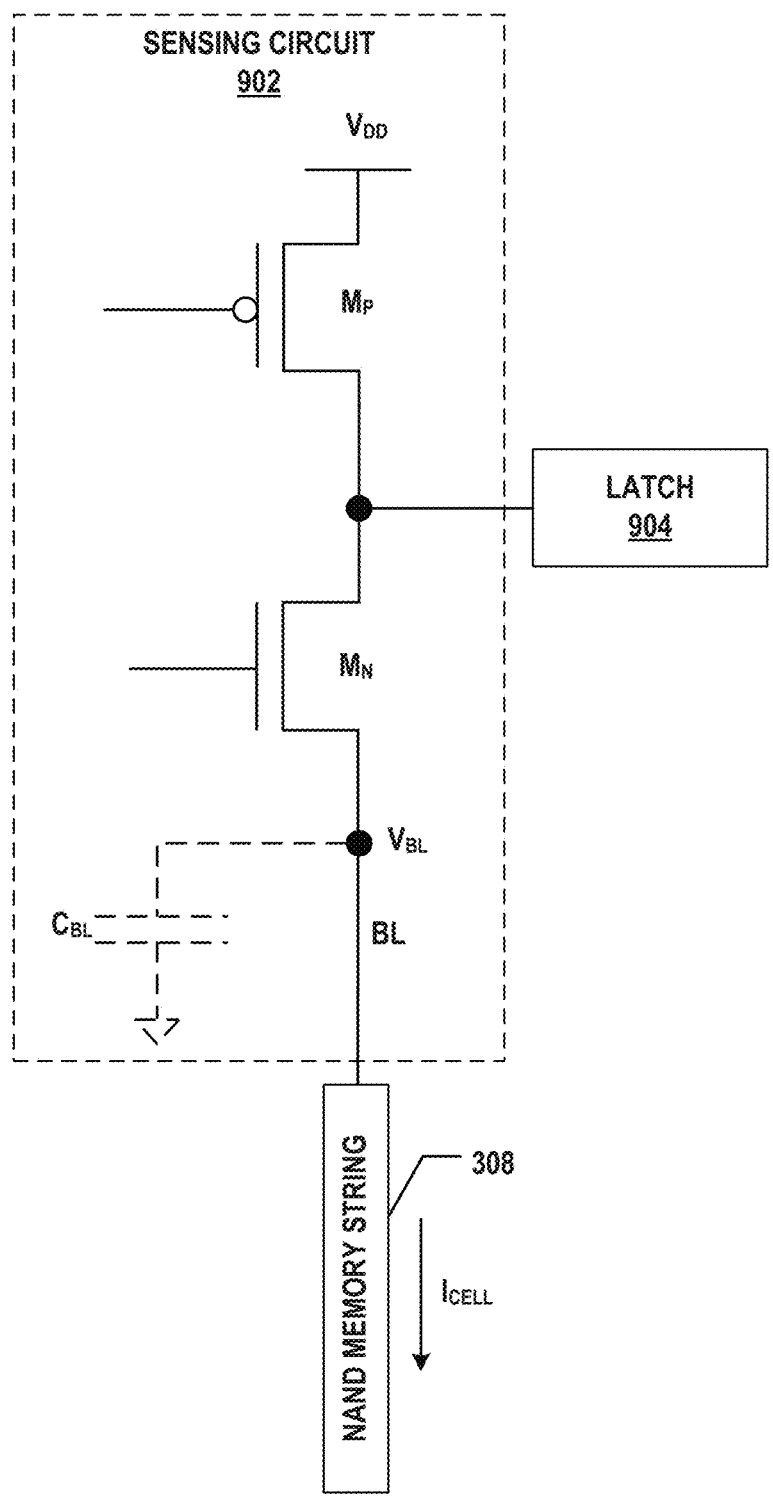
FIG. 10 illustrates a detailed block diagram of the page buffer/sense amplifier in FIG. 9, according to some aspects of the present disclosure.

Referring to FIG. 10, each sensing circuit 902 of page buffer/sense amplifier 504 can include a PMOS Mp coupled to a supply voltage Vdd, and an NMOS Mn coupled to the PMOS and a respective NAND memory string 308 through the respective bit line BL. It is understood that additional components may be included in sensing circuit 902 as well. As shown in FIG. 10, a bit line capacitor $C_{BL}$ can be formed between the bit line BL and the ground, which may include the parasitic capacitor between adjacent bit lines BLs and with other dedicated capacitor(s) (not shown). During the read setup stage of a read operation, when a read voltage is applied to memory cells 306 coupled to selected word line 318, a cell current $I_{CELL}$ can be generated by NAND memory string 308 (functioning as a current source) and flow through the bit line BL. Given a fixed gate voltage (i.e., the read voltage) applied to select memory cell 306 in NAND memory string 308, the cell current $I_{CELL}$ is a function of the threshold voltage of select memory cell 306. Thus, through the measurement of the cell current $I_{CELL}$, it can understand which threshold voltage distribution select memory cell 306 belongs to.

Figure 13:
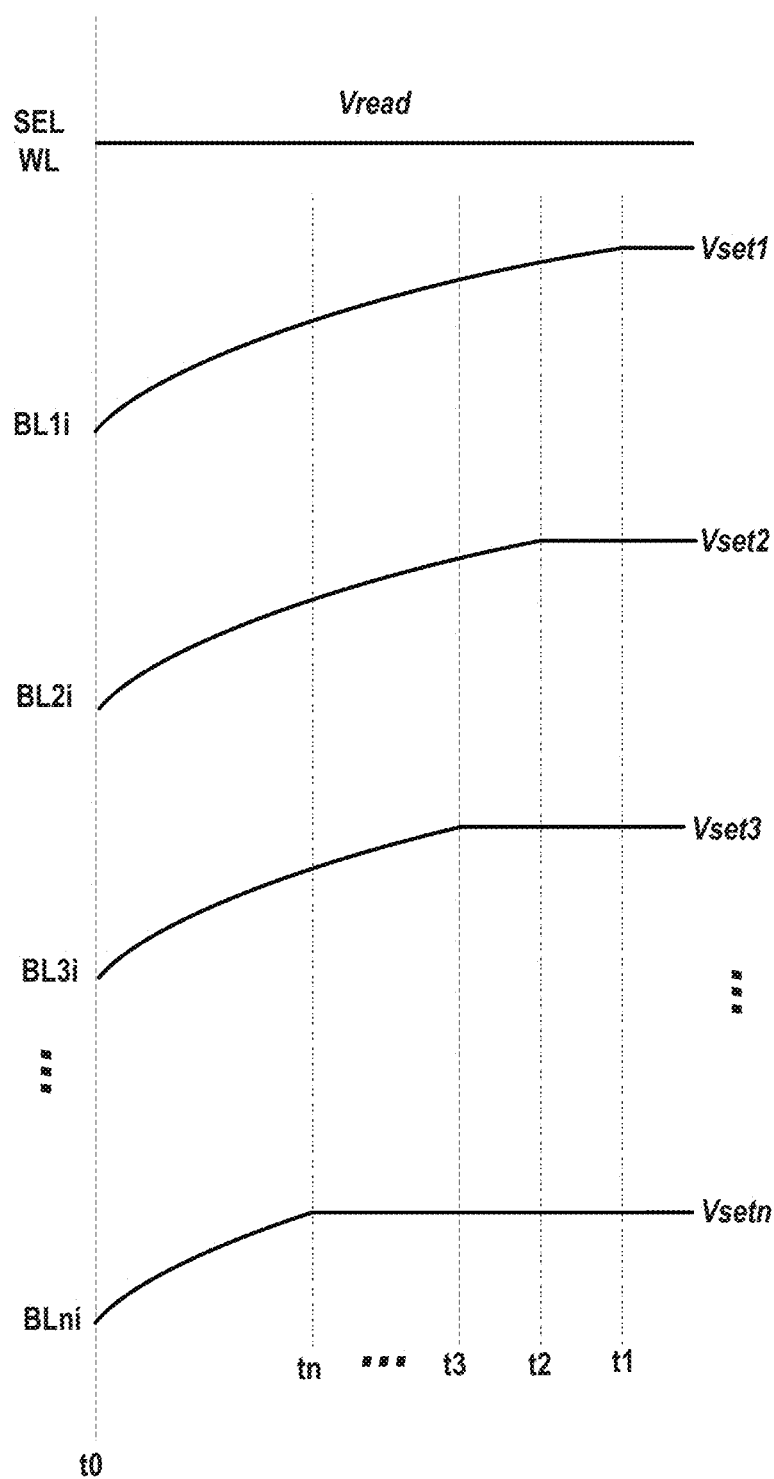
FIG. 13 illustrates a waveform diagram of the dynamic AVD scheme based on varying sense develop times and memory cells grouping in FIG. 12, according to some aspects of the present disclosure.

During the read setup stage, the constant cell current $I_{CELL}$ also charges the bit line capacitor $C_{BL}$ for the sense develop time T, known as a pre-charge process. The sense develop time can be controlled by turning on/off PMOS Mp and NMOS Mn to charge/discharge the bit line capacitor $C_{BL}$. Since current cell $I_{CELL}$ correlates to the threshold voltage, by varying the sense develop time T, the setup voltage of the bit line voltage $V_{BL}$ (i.e., the final voltage on the bit line BL at the end of the read setup stage) and the threshold voltage can be controlled by controlling the sense develop time T For example, as shown in FIG. 13, a read voltage Vread may be applied to selected word line SEL WL by row decoder/word line driver 508, and different sense develop times may be applied to different groups of bit lines BL1i, BL2i, BL3i, . . . , BLni for pre-charging different groups of bit lines BL1i, BL2i, BL3i, . . . , BLni. That is, instead of fully pre-charging each bit line BL with a sufficient long sense develop time to reach the same setup voltage on each bit line BL, different groups of bit lines BL1i, BL2i, BL3i, . . . , BLni may be pre-charged for different sense develop times, thereby reaching different setup voltages Vset1, Vset2, Vset3, . . . , Vsetn, on each group of bit lines BL1i, BL2i, BL3i, or, BLni, which have the same effect of having different read voltages in parallel at different threshold voltages applied to different memory cells 306 coupled to different groups of bit lines BL1i, BL2i, BL3i, . . . , BLni. In some implementations, since the threshold voltages defining the reference threshold voltage intervals and unit threshold voltage intervals in the dynamic AVD scheme described above are not set directly, but indirectly based on the sense develop times, the sense develop times applied to different groups bit lines BL1i, BL2i, BL3i, . . . , BLni are determined such that the unit threshold voltage intervals still have the same range of threshold voltages as described above.

Referring back to FIG. 9, in some implementations, a coarse read process is performed first to define the reference voltage that is within one of the two adjacent distributions where the valley is to be detected to reduce the number of times C to be counted by page buffer/sense amplifier 504. To perform the coarse read process, row decoder/word line driver 508 is configured to apply the reference voltage as the read voltage applied to selected word line 318, and page buffer/sense amplifier 504 is further configured to identify each memory cells 306 that has a threshold voltage smaller than the reference voltage. The identified memory cells 306 thus can be inhibited during the subsequent AVD, i.e., being excluded from counting the numbers C in the reference threshold voltage intervals. It is understood that in some examples, the coarse read process may be skipped, such that the reference voltage used for defining the reference threshold voltage intervals when counting the number of times C may still be the default reference voltage that used for fail bit count, e.g., 0 V or within the lowest distribution (e.g., corresponding to the erased state).

As described above, each sensing circuit 902 of page buffer/sense amplifier 504 can sense whether the threshold voltage of a respective memory cell 306 is in a respective reference threshold voltage interval, and a respective latch 904 coupled to sensing circuit 902 can record the sensing result. Counter 906 of page buffer/sense amplifier 504 can then count the number of times C from latches 904 of all memory cells 306 coupled to selected word line 318 or a group of memory cells 306 coupled to a respective group of bit lines 316 based on various dynamic AVD schemes described above in detail. Auto valley detector 910 of control logic 512 can thus determine the numbers D of sets of memory cells 306 in the unit threshold voltage intervals by calculating the differences between the numbers of times C based on the counting results.

Auto valley detector 910 can be further configured to estimate a valley voltage corresponding to a state based, at least in part, on the comparison between the numbers D, which indicates the trend of the distribution curve. The valley voltage can be at a valley between the two adjacent distributions. In some implementations, the state is the highest state of the states (e.g., state 15 of a QLC), which is the most susceptible to the distribution shift due to retention as described above. The detailed schemes of estimating the valley voltage based on the comparison between the numbers D are described above with respect to FIGS. 7 and 8A-8G and thus, are not repeated for ease of description.

In some implementations, read level optimizer 912 is configured to receive the estimated valley voltage corresponding to one state (e.g., the highest state) from auto valley detector 910 and determine optimal read voltages corresponding to other state(s) used for read operations. Depending on the number of bits stored in each memory cell 306 and the gray code used for programming and reading, a number of read voltages corresponding to one or more states may be used for read operations. The estimated valley voltage can be used as the optimal read voltage corresponding to the same state, and other optimal read voltages can be further determined by read level optimizer 912 based on the offset between the estimated valley voltage and the default read voltage corresponding to the same state. In some implementations, read level optimizer 912 is configured to determine a first offset corresponding to the first state between the valley voltage and a first default read voltage corresponding to the first state. The default read voltages can be stored, for example, in registers 514, and retrieved by read level optimizer 912 to calculate the offset from the estimated valley voltage. The offset then may be used as a base offset to determine another offset corresponding to another state based on an offset model 914.

Offset model 914 can be built based on the relationship between the levels of shift among different distributions, for example, with respect to the base offset corresponding to the highest state, due to retention, back pattern effect, and/or any other phenomena. In some implementations, offset model 914 includes a coefficient A for each state. For example, for QLC that includes 15 programmed states, offset model 914 may include 15 coefficients A1, A2, A3, ..., A15 for each programmed state, which may be normalized such that the coefficient A15 for the base offset is equal to 1. In some implementations, offset model 914 includes a plurality sets of offset lookup tables (LUTs), and each set of LUTs corresponds to an offset value or a range of offsets values of the base offset and includes offsets for all other states. The information contained in offset model 914, such as the coefficients or the LUTs, can be pre-determined based on existing data or experience, for example, using calibration.

In some implementations, read level optimizer 912 is further configured to determine a second offset corresponding to a second state based, at least in part, on the first offset. That is, read level optimizer 912 can determine other offset(s) corresponding to any other states based on the base offset and offset model 914. For example, offset model 914 may include 15 coefficients A1, A2, A3, ..., A15 for each programmed state, and the read offsets for other states may be calculated based on the base offset S and the respective coefficients An, i.e., An×S. In another example in which offset model 914 includes LUTs, a set of LUTs may be first selected by matching the base offset with the offset value or range associated with the set of LUTs, and the specific read offsets for other states may be found from the set of LUTs based on the states corresponding to the read offsets.

In some implementations, read level optimizer 912 is further configured to determine a second read voltage corresponding to the second state based, at least in part, on the second offset and a second default read voltage corresponding to the second state. That is, read level optimizer 912 can further determine optimal read voltages of other states that are needed for read operations based on the corresponding default read voltages (e.g., retrieved from registers 514) and the read offsets. It is understood that any final or interim results obtained by read level optimizer 912 (e.g., the base offset, other read offsets, or the optimal read voltages) may be stored in registers 514 as well in some examples.

In some implementations, read controller 908 is configured to initiate a read operation on memory cells 306 coupled to selected word line 318 using at least the second read voltage. That is, read level optimizer 912 can provide optimal read voltage(s) to read controller 908 such that read controller 908 can initiate a subsequent read operation using the optimal read voltage(s), as opposed to the default read voltage(s), thereby compensating for the threshold voltage distribution shift due to retention charge loss, back pattern effect, and/or any other phenomena and reducing the read errors. In some implementations, read controller 908 sends control signals to voltage generator 510 to control voltage generator 510 to generate the read voltages at the optimal read levels, and provide the optimal read voltages to row decoder/word line driver 508. Read controller 908 can also send control signals to row decoder/word line driver 508 to control row decoder/word line driver 508 to sequentially apply the optimal read voltages to selected word line 318. That is, row decoder/word line driver 508 can be configured to sequentially apply the optimal read voltages to selected word line 318 to differentiate memory cells 306 in different states based on the optimal read voltages.

As described above with respect to FIG. 9, the dynamic AVD can be initiated by control logic 512 of peripheral circuits 302 at the beginning of a read operation to dynamically compensate for the threshold voltage distribution shift due to retention charge loss, back pattern effect, and/or any other phenomena during the sequential read operation, thereby reducing the read errors of the read operation. By performing the AVD right before a read operation, the accuracy of the compensation can be maximized for the read operation, while the duration of the read operation is increased. Alternatively or additionally, in some implementations, the dynamic AVD scheme is initiated by a memory controller (e.g., memory controller 106) using a dedicated AVD command that returns the information associated with the valley voltage corresponding to any state. The returned information thus can be utilized by the memory controller for determining the optimal read voltage levels or any other suitable applications. The memory controller can provide the optimal read voltages to peripheral circuits 302 of memory device 300 periodically or as needed to update the default read voltages stored in registers 514 of peripheral circuits 302. By performing the AVD in response to a dedicated AVD command issued by a memory controller that is separate from a read operation, the scope of applications of the AVD can be expanded, and the duration of a read operation is not affected. The accuracy of the compensation may be determined based on the frequency of the AVD commands that update the stored optimal read voltage levels.

Figure 11:
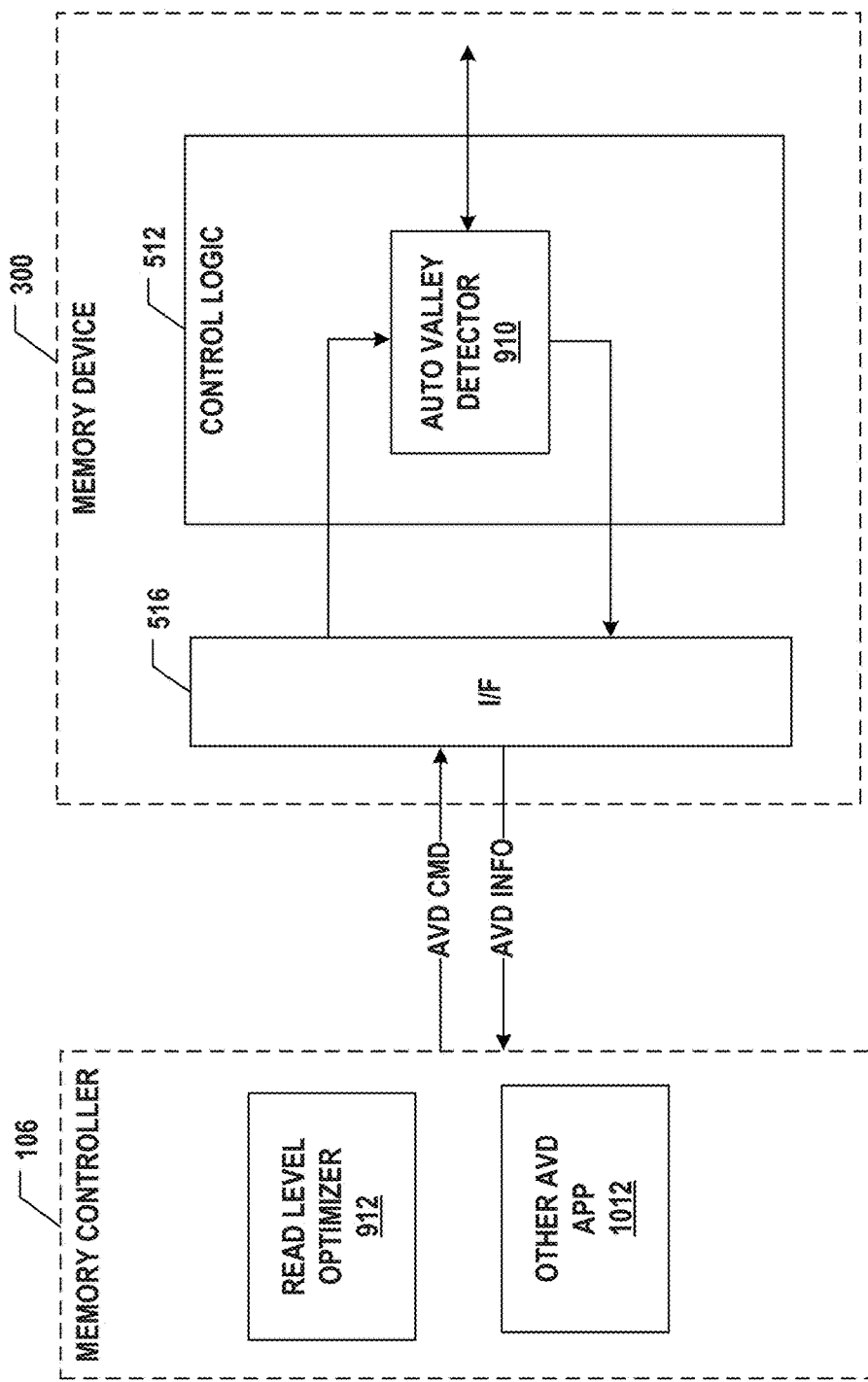
FIG. 11 illustrates a detailed block diagram of control logic and a memory controller of the memory system in FIG. 1, according to some aspects of the present disclosure.

For example, FIG. 11 illustrates a detailed block diagram of control logic 512 and memory controller 106 of memory system 102 in FIG. 1, according to some aspects of the present disclosure. As shown in FIG. 11, peripheral circuits 302 of memory device 300 can include interface 516 and control logic 512 that includes auto valley detector 910. The details of auto valley detector 910 are described above with respect to FIG. 9 and thus, are not repeated for ease of description. Different from control logic 512 in FIG. 9, control logic 512 in FIG. 11 does not include read level optimizer 912 that is described above. Other suitable components of peripheral circuits 302 of memory device 300, such as page buffer/sense amplifier 504, row decoder/word line driver 508, and voltage generator 510, are omitted from FIG. 11 for ease of description as well.

In some implementations, memory controller 106 is coupled to memory device 300 and configured to send an AVD command (AVD CMD) to peripheral circuit 302 of memory device 300 to cause peripheral circuit 302 to perform the dynamic AVD schemes described herein to estimate the valley voltage. The AVD command can be received by interface 516. In some implementations, the AVD command is indicative of the state corresponding to the valley voltage to be estimated by the AVD. In other words, memory controller 106 can specify the target state on which the dynamic AVD is to be performed, such as the highest state. Interface 516 can be configured to process the AVD command to obtain information related to the AVD, such as the target state, and send instructions to auto valley detector 910 of control logic 512 to initiate the AVD accordingly.

In some implementations, auto valley detector 910 of memory device 300 is configured to send information (AVD INFO) associated with the valley voltage to memory controller 106, for example, through interface 516. The information associated with the valley voltage can include the valley voltage corresponding to the target state or an offset corresponding to the target state between the valley voltage and the default read voltage corresponding to the target state. That is, auto valley detector 910 can send either the estimated valley voltage itself without further calculating the base offset, or calculate the base offset first and then send the base offset to memory controller 106.

As shown in FIG. 11, memory controller 106 can include read level optimizer 912 and other AVD application 1012. Read level optimizer 912 can determine another offset corresponding to another state based, at least in part, on the information associated with the valley voltage. Read level optimizer 912 can optimize read voltages corresponding to any suitable states based on the base offset or the valley voltage from the information received from memory device 300. That is, read level optimizer 912 may be implemented in memory controller 106 as opposed to control logic 512 of memory device 300. The details of read level optimizer 912 are described above with respect to FIG. 9 and thus, are not repeated for ease of description. In some implementation, read level optimizer 912 is configured to send the optimal read voltages periodically or as needed to memory device 300 to update the default read voltages used by memory device 300 for read operations. Besides read voltage level optimization, the information associated with the valley voltage obtained from the dynamic AVD may be used in any other AVD applications 1012 that are implemented in memory controller 106. Other AVD applications 1012 can be implemented as firmware modules stored in the RAM and executed by the MCU of memory controller 106, or implemented as ASICs, including a digital circuit, an analog circuit, and/or a mixed-signal circuit.

Figure 14:
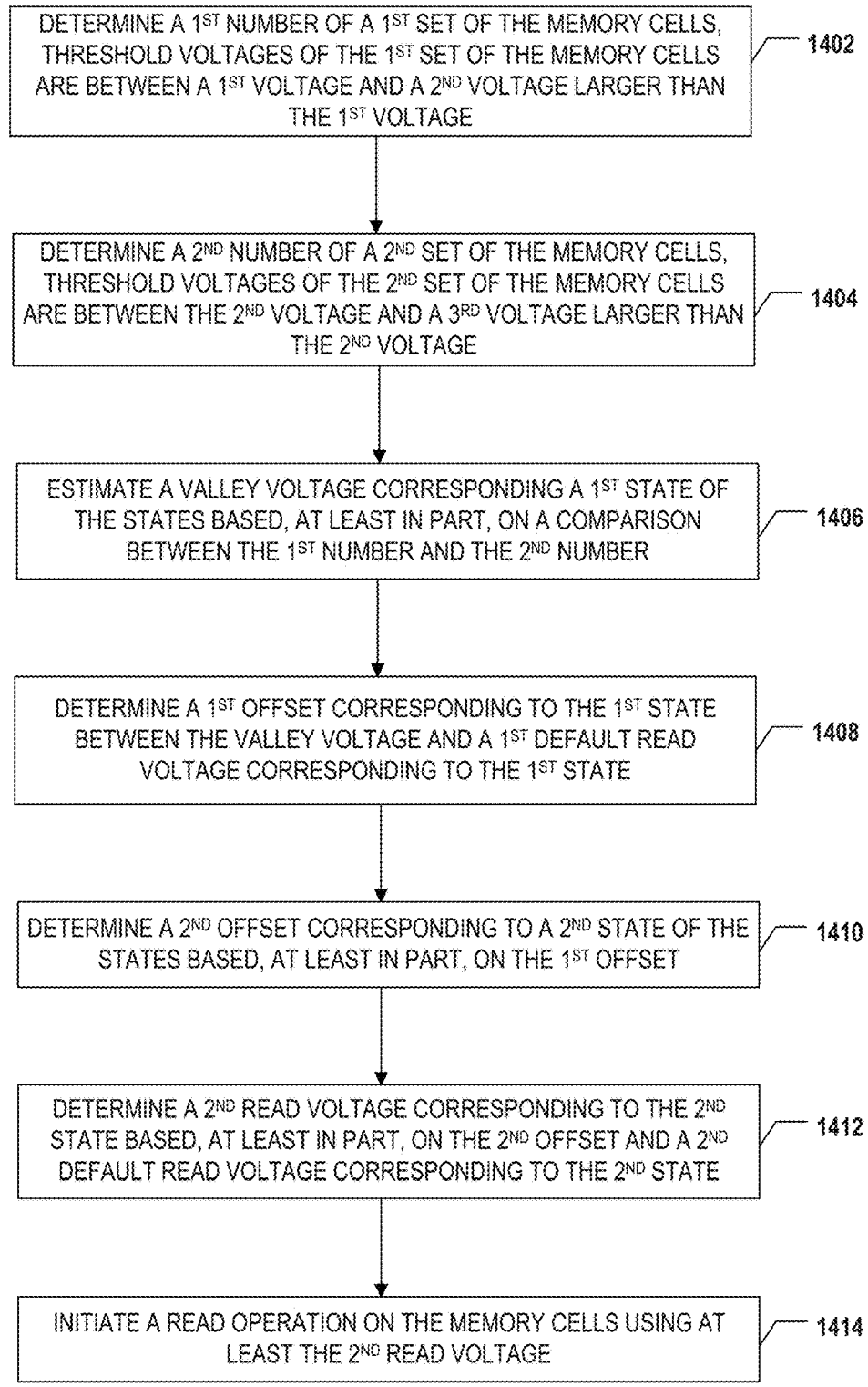
FIG. 14 illustrates a flowchart of a method for operating a memory device, according to some aspects of the present disclosure.

FIG. 14 illustrates a flowchart of a method 1400 for operating a memory device, according to some aspects of the present disclosure. The memory device may be any suitable memory device disclosed herein, such as memory device 300. Method 1400 may be implemented by peripheral circuits 302, such as control logic 512, page buffer/sense amplifier 504, and row decoder/word line driver 508. It is understood that the operations shown in method 1400 may not be exhaustive and that other operations can be performed as well before, after, or between any of the illustrated operations. Further, some of the operations may be performed simultaneously, or in a different order than shown in FIG. 14. For example, operations 1402 and 1404 may be performed simultaneously.

Referring to FIG. 14, method 1400 starts at operation 1402, in which a first number of a first set of the memory cells is determined. The threshold voltages of the first set of the memory cells can be between a first voltage and a second voltage larger than the first voltage. Method 1400 proceeds to operation 1404, as illustrated in FIG. 14, in which a second number of a second set of the memory cells is determined. The threshold voltages of the second set of the memory cells can be between the second voltage and a third voltage larger than the second voltage. In some implementations, a difference between the second voltage and the first voltage is the same as a difference between the third voltage and the second voltage. In some implementations, the threshold voltages of the memory cells have a plurality of distributions corresponding to the states of the memory cells, respectively. In some implementations, the first, second, and third voltages are between centers of two adjacent distributions of the distributions.

Figure 15:
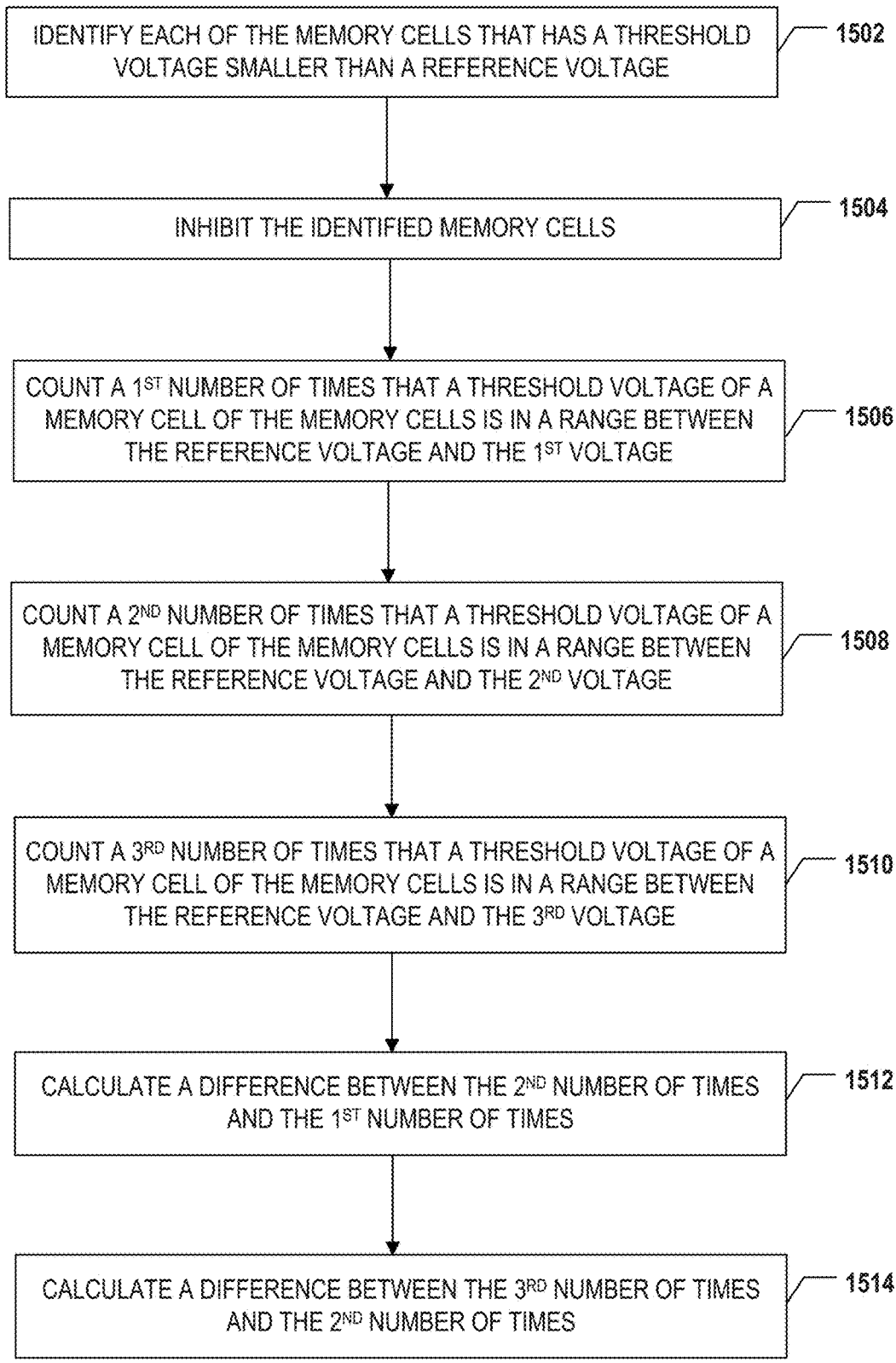
FIG. 15 illustrates a flowchart of a method for dynamic AVD, according to some aspects of the present disclosure.

As shown in FIG. 15, in some implementations, prior to determining the first number of the first set of memory cells, at operation 1502, each memory cell that has a threshold voltage smaller than a reference voltage is identified, and the identified memory cells are inhibited at operation 1504. In some implementations, the reference voltage is within one of the two adjacent distributions and is smaller than the first voltage. For example, peripheral circuits 302 may perform a coarse read process to identify and exclude certain memory cells that have threshold voltages below a reference voltage from the AVD.

As shown in FIG. 15, in some implementations, to determine the first number of the first set of memory cells, at operation 1506, a first number of times that a threshold voltage of a memory cell of the memory cells is in a range between the reference voltage and the first voltage is counted. For example, page buffer/sense amplifier 504 may count the number of times C of memory cells 306 in a first reference threshold voltage interval defined by the reference voltage and the first voltage. In some implementations, to determine the first and second numbers of the first and second sets of memory cells, at operation 1508, a second number of times that a threshold voltage of a memory cell of the memory cells is in a range between the reference voltage and the second voltage is counted. For example, page buffer/sense amplifier 504 may count the number of times C of memory cells 306 in a second reference threshold voltage interval defined by the reference voltage and the second voltage. In some implementations, to determine the second number of the second set of memory cells, at operation 1510, a third number of times that a threshold voltage of a memory cell of the memory cells is in a range between the reference voltage and the third voltage is counted. For example, page buffer/sense amplifier 504 may count the number of times C of memory cells 306 in a third reference threshold voltage interval defined by the reference voltage and the third voltage.

In some implementations, to count the first, second, and third numbers of times, a read voltage is applied to the word line, and a first group of the bit lines, a second group of the bit lines, and a third group of the bit lines are pre-charged in parallel for a first sense develop time, a second sense develop time, and a third sense develop time, respectively. The third sense develop time may be longer than the second sense develop time, and the second sense develop time may be longer than the first sense develop time. For example, in the read setup stage of a read operation, sensing circuits 902 may pre-charge different groups of bit lines 316 for different sense develop times in parallel, when row decoder/word line driver 508 applies a read voltage to selected word line 318.

As shown in FIG. 15, in some implementations, to determine the first number of the first set of memory cells, at operation 1512, a difference between the second number of times and the first number of times is calculated as the first number of the first set of the memory cells, and at operation 1514, a difference between the third number of times and the second number of times is calculated as the second number of the second set of the memory cells. For example, auto valley detector 910 of control logic 512 may calculate the difference between the numbers of times C in two adjacent reference threshold voltage intervals as the number D of the set of memory cells 306 in a respective unit threshold voltage interval.

Referring back to FIG. 14, method 1400 proceeds to operation 1406, in which a valley voltage corresponding to a first state of the states is estimated based, at least in part, on a comparison between the first number and the second number. In some implementations, the valley voltage is at a valley between the two adjacent distributions. In some implementations, the valley voltage is equal to or larger than the third voltage when the first number is larger than the second number. In some implementations, the valley voltage is equal to or smaller than the first voltage when the first number is smaller than the second number. In some implementations, the valley voltage is equal to the second voltage when the first number is the same as the second number. For example, auto valley detector 910 of control logic 512 may estimate the valley voltage corresponding to the target state, e.g., the highest state, based on the comparison between the numbers D of sets of memory cells 306 in unit threshold voltage intervals. The valley voltage may be used as the optimal read voltage corresponding to the target state.

Method 1400 proceeds to operation 1408, as illustrated in FIG. 14, in which a first offset corresponding to the first state between the valley voltage and a first default read voltage corresponding to the first state is determined. For example, auto valley detector 910 or read level optimizer 912 of control logic 512 may calculate the base offset of the target state based on the estimated valley voltage and the default read voltage corresponding to the target state stored in register 514.

Method 1400 proceeds to operation 1410, as illustrated in FIG. 14, in which a second offset corresponding to a second state of the states is determined based, at least in part, on the first offset. For example, read level optimizer 912 of control logic 512 or read level optimizer 912 of memory controller 106 may determine read offsets corresponding to other states based on the base offset and offset model 914.

Method 1400 proceeds to operation 1412, as illustrated in FIG. 14, in which a second read voltage corresponding to the second state is determined based, at least in part, on the second offset and a second default read voltage corresponding to the second state. For example, read level optimizer 912 of control logic 512 or read level optimizer 912 of memory controller 106 may calculate optimal read voltages corresponding to any other states based on the read offsets and respective default read voltages.

Method 1400 proceeds to operation 1414, as illustrated in FIG. 14, in which a read operation on the memory cells is initiated using at least the second read voltage. For example, read controller 908 of control logic 512 may initiate a read operation using the optimal read voltages.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

What is claimed is:

1. A memory device, comprising:
memory cells coupled to a same word line and bit lines, respectively, wherein each of the memory cells is in one of states; and
a peripheral circuit coupled to the memory cells through the word line and the bit lines, and configured to:
determine a first number of a first set of the memory cells and a second number of a second set of the memory cells, threshold voltages of the first set of the memory cells being between a first voltage and a second voltage larger than the first voltage, and threshold voltages of the second set of the memory cells being between the second voltage and a third voltage larger than the second voltage;
estimate a valley voltage corresponding to a first state of the states based, at least in part, on a comparison between the first number of the first set of the memory cells and the second number of the second set of the memory cells;
determine a read voltage level offset corresponding to the first state based on the estimated valley voltage; wherein
the valley voltage is equal to or larger than the third voltage when the first number is larger than the second number,
the valley voltage is equal to or smaller than the first voltage when the first number is smaller than the second number, and
the valley voltage is equal to the second voltage when the first number is the same as the second number.

2. The memory device of claim 1, wherein a difference between the second voltage and the first voltage is the same as a difference between the third voltage and the second voltage.

3. The memory device of claim 1, wherein the peripheral circuit is further configured to:
adjust a read voltage based on the read voltage level offset for at least one of the first set of the memory cells or the second set of the memory cells; and
perform a read operation on a memory cell of the first set of the memory cells or the second set of the memory cells based on the read voltage adjusted based on the read voltage level offset.

4. The memory device of claim 1, wherein:
threshold voltages of the memory cells have distributions corresponding to the states, respectively,
the first, second, and third voltages are between centers of two adjacent distributions of the distributions,
the valley voltage is at a valley between the two adjacent distributions, and
to determine the first and second numbers, the peripheral circuit comprises:
a page buffer coupled to the memory cells through the bit lines, respectively, and configured to:
count a first number of times that a threshold voltage of a memory cell of the memory cells is in a range between a reference voltage and the first voltage;
count a second number of times that a threshold voltage of a memory cell of the memory cells is in a range between the reference voltage and the second voltage; and
count a third number of times that a threshold voltage of a memory cell of the memory cells is in a range between the reference voltage and the third voltage; and
control logic coupled to the page buffer and configured to:
calculate a difference between the second number of times and the first number of times as the first number of the first set of the memory cells; and
calculate a difference between the third number of times and the second number of times as the second number of the second set of the memory cells.

5. The memory device of claim 4, wherein the reference voltage is within one of the two adjacent distributions and is smaller than the first voltage.

6. The memory device of claim 5, wherein to determine the first and second numbers, the page buffer is further configured to:

identify each of the memory cells that has a threshold voltage smaller than the reference voltage; and inhibit the memory cells identified that have a threshold voltage smaller than the reference voltage when determining the first number of times, the second number of times, and the third number of times.

7. The memory device of claim 4, wherein:

to determine the first and second numbers, the peripheral circuit further comprises a word line driver coupled to the memory cells through the word line and configured to:

apply a read voltage to the word line, and the page buffer is further configured to:

pre-charge a first group of the bit lines for a first sense develop time, a second group of the bit lines for a second sense develop time, and a third group of the bit lines for a third sense develop time, the third sense develop time being longer than the second sense develop time, and the second sense develop time being longer than the first sense develop time.

8. The memory device of claim 4, wherein the control logic is further configured to:

determine a first offset corresponding to the first state between the valley voltage and a first default read voltage corresponding to the first state; and determine a second offset corresponding to a second state of the states based, at least in part, on the first offset.

9. The memory device of claim 8, wherein the control logic is further configured to:

determine a second read voltage corresponding to the second state based, at least in part, on the second offset and a second default read voltage corresponding to the second state; and initiate a read operation on the memory cells using at least the second read voltage.

10. The memory device of claim 1, wherein the first state is a highest state of the states.

11. The memory device of claim 1, wherein the memory device is a three-dimensional NAND memory device.

12. A memory system, comprising:

a memory device configured to store data and comprising:

memory cells coupled to a same word line and bit lines, respectively, wherein each of the memory cells is in one of states; and a peripheral circuit coupled to the memory cells through the word line and the bit lines, and configured to:

determine a first number of a first set of the memory cells and a second number of a second set of the memory cells, threshold voltages of the first set of the memory cells being between a first voltage and a second voltage larger than the first voltage, and threshold voltages of the second set of the memory cells being between the second voltage and a third voltage larger than the second voltage;

estimate a valley voltage corresponding to a first state of the states based, at least in part, on a comparison between the first number of the first set of the memory cells and the second number of the second set of the memory cells;

determine a read voltage level offset corresponding to the first state based on the estimated valley voltage;

a memory controller coupled to the memory device and configured to send a command to the peripheral circuit to cause the peripheral circuit to determine the first and second numbers and estimate the valley voltage; wherein the valley voltage is equal to or larger than the third voltage when the first number is larger than the second number, the valley voltage is equal to or smaller than the first voltage when the first number is smaller than the second number, and the valley voltage is equal to the second voltage when the first number is the same as the second number.

13. The memory system of claim 12, wherein the peripheral circuit is further configured to:

send information associated with the valley voltage to the memory controller.

14. The memory system of claim 13, wherein the memory controller is further configured to:

determine an offset corresponding to a second state of the states based, at least in part, on the information associated with the valley voltage.

15. A method for operating a memory device, comprising:

determining a first number of a first set of memory cells and a second number of a second set of the memory cells, the memory cells being coupled to a same word line and bit lines, respectively, each of the memory cells being in one of states, threshold voltages of the first set of the memory cells being between a first voltage and a second voltage larger than the first voltage, and threshold voltages of the second set of the memory cells being between the second voltage and a third voltage larger than the second voltage;

estimating a valley voltage corresponding to a first state of the states based, at least in part, on a comparison between the first number of the first set of the memory cells and the second number of the second set of the memory cells;

determining a read voltage level offset corresponding to the first state based on the estimated valley voltage; wherein the valley voltage is equal to or larger than the third voltage when the first number is larger than the second number, the valley voltage is equal to or smaller than the first voltage when the first number is smaller than the second number, and the valley voltage is equal to the second voltage when the first number is the same as the second number.

16. The method of claim 15, wherein a difference between the second voltage and the first voltage is the same as a difference between the third voltage and the second voltage.

17. The method of claim 15, wherein:

threshold voltages of the memory cells have distributions corresponding to the states, respectively, the first, second, and third voltages are between centers of two adjacent distributions of the distributions, and the valley voltage is at a valley between the two adjacent distributions.

18. The method of claim 15, further comprising:

determining a first offset corresponding to the first state between the valley voltage and a first default read voltage corresponding to the first state; and determining a second offset corresponding to a second state of the states based, at least in part, on the first offset.

* * * * *